United States Patent [19]

Okamoto

[11] Patent Number: 5,837,423
[45] Date of Patent: *Nov. 17, 1998

[54] SEMICONDUCTOR IC DEVICE FABRICATING METHOD

[75] Inventor: Yoshihiko Okamoto, Kodaira, Japan

[73] Assignee: Hitachi, Ltd., Tokyo, Japan

[*] Notice: The term of this patent shall not extend beyond the expiration date of Pat. No. 5,641,715.

[21] Appl. No.: 804,922

[22] Filed: Feb. 24, 1997

Related U.S. Application Data

[62] Division of Ser. No. 393,914, Feb. 24, 1995, Pat. No. 5,641,715.

[30] Foreign Application Priority Data

Feb. 24, 1994 [JP] Japan ...................................... 6-26992
Oct. 12, 1994 [JP] Japan ..................................... 6-246596

[51] Int. Cl.⁶ ....................................................... G03C 5/00
[52] U.S. Cl. ........................... 430/296; 430/326; 430/330
[58] Field of Search ..................................... 430/296, 326, 430/330

[56] References Cited

U.S. PATENT DOCUMENTS 5,372,914  12/1994  Naito et al. .............................. 430/296
5,614,715   3/1997  Okamoto ................................. 438/669

FOREIGN PATENT DOCUMENTS 63-287950  11/1988  Japan.

*Primary Examiner*—Janet C. Baxter
*Assistant Examiner*—Rosemary Ashton
*Attorney, Agent, or Firm*—Antonelli, Terry, Stout & Kraus, LLP

[57] ABSTRACT

Either a chemical amplification positive electron beam resist film or a chemical amplification negative electron beam resist film is used selectively according to an IC fabricating process when forming a minute IC pattern by using, as a mask, a resist pattern formed by irradiating the chemical amplification electron beam resist film formed on a semiconductor wafer with an electron beam, to form the minute IC pattern quickly in a high accuracy and to carry out an electron beam direct writing at a high throughput. The chemical amplification electron beam resist film is coated with a conductive polymer film before irradiating the same with the electron beam to prevent the charging-up of the chemical amplification electron beam resist film and to stabilize the chemical amplification electron beam resist film during a electron beam writing process.

22 Claims, 23 Drawing Sheets

41 : MARK DETECTING SYSTEM (MARK DETECTING MEANS)
43 : REFERENCE MARK

SEMICONDUCTOR IC DEVICE FABRICATING METHOD

This application is a Divisional application of application Ser. No. 08/393,914, filed Feb. 24, 1995, U.S. Pat. No. 5,614,715.

BACKGROUND OF THE INVENTION

The present invention relates to a semiconductor IC device fabricating method and, more particularly, to techniques using electron beam resists and effectively applicable to processing a minute IC pattern.

An exposure process for forming a desired IC pattern on a semiconductor wafer among those of a recent method of fabricating a semiconductor IC circuit device employs an exposure technique using an electron beam instead of ultraviolet rays. An electron beam direct writing system, which writes IC pattern directly on a semiconductor wafer coated with an electron beam resist film with an electron beam, has attracted a great deal of attention because of its capability of forming a minute IC pattern on a semiconductor wafer superior to that of the conventional optical exposure system which transfers an IC pattern formed on a photomask on a semiconductor wafer.

The electron beam direct writing system, differing from the optical exposure system which transfers all the portions of an IC pattern formed on a photomask fully onto a semiconductor wafer, writes an IC pattern on a semiconductor wafer with an electron beam focused in a spot of a predetermined size. Therefore, it is a particularly important problem in carrying out the electron beam direct writing system to reduce the throughput of the IC pattern writing process.

A first factor that determines the throughput of the IC pattern writing process is time necessary for irradiating a resist film to form an exposed IC pattern in the resist film. Efforts have been made in various fields to develop an electron beam resist having improved sensitivity. A chemical amplification resist is an example of a recently proposed electron beam resist. When this chemical amplification resist is exposed to an electron beam, a free acid is produced therein and the free acid acts as a catalyst to promote exposure reaction when the resist is heat-treated after exposure to an electron beam.

This chemical amplification resist is mentioned in, for example, Journal of Photopolymer Science and Technology, Vol. 2, No. 1, pp.115–122 (1989).

SUMMARY OF THE INVENTION

Although the chemical amplification electron beam resist, which promotes exposure reaction by the acid produced when irradiated with an electron beam as a catalyst, has a high sensitivity and a capability of forming a pattern in a high resolution, the chemical amplification electron beam resist is difficult to apply to practical use because the chemical amplification electron beam resist is highly susceptible to aging and requires troublesome handling.

An electron beam exposure method proposed to enhance greatly the throughput of the direct electron beam writing process in Japanese Patent Laid-open (Kokai) No. 62-260322 uses an electron beam transmitting column provided at a given position thereon with an aperture having the shape of a unit pattern of a desired iterative pattern (hereinafter referred to as "mask"), and projects an electron beam shaped in the pattern repeatedly through the mask. The aperture formed in a small area on the mask in the shape of the pattern passes portions of an electron beam having a comparatively large cross section selectively to form an electron beam having a cross section identical with the pattern to form the pattern on a resist film by a single exposure action. The optical system of an electron beam device employed in carrying out this method is disclosed in U.S. Pat. No. 4,213,053.

Even in this previously proposed electron beam exposure method, time necessary for exposing the resist film to the electron beam is a factor that determines the throughput of the electron beam exposure process when applied to fabricating an IC having a very large degree of integration, because the resist film must be exposed to the electron beam repeatedly.

The electron beam direct writing technique using the mask provided with the aperture was proposed as an effective means for enhancing the throughput.

When this electron beam exposure method is applied to fabricating a semiconductor IC device, a plurality of masks respectively provided with apertures are used respectively for processes for forming a semiconductor IC, and a variable shaped beam is used for other processes to form patterns.

The electron beam exposure method is subject to restrictions on the characteristics of resist films, such as the types of the resist films, i.e., a positive type or a negative type and, therefore, the electron beam exposure method using the masks respectively provided with apertures has problems connected with resist materials.

Accordingly, it is a first object of the present invention to provide techniques capable of realizing efficient direct electron beam writing at high throughput.

A second object of the present invention is to provide techniques using a chemical amplification electron beam resist and capable of realizing highly accurate direct electron beam writing.

A third object of the present invention is to elucidate restrictions on a direct electron beam writing method selectively using a plurality of masks respectively having patterned apertures for forming patterns with shaped electron beams and on the characteristics of resists and to provide techniques capable of efficiently forming the patterns.

A fourth object of the present invention is to provide techniques capable of realizing means for efficiently forming a minute pattern of an IC on a semiconductor wafer at high throughput by using a direct electron beam writing method and an optical exposure method in combination.

A fifth object of the present invention is to provide techniques using a chemical amplification electron beam resist and capable of realizing highly accurate direct electron beam writing.

The above and other objects and novel features of the present invention will become more apparent from description given herein in connection with the accompanying drawings.

Representative features of a first embodiment of the present inventions among those concretely described herein will be briefly described below.

(1) A semiconductor IC device fabricating method in accordance with the present invention has a plurality of electron beam exposure processes each forming a resist pattern by irradiating a chemical amplification resist film formed on a semiconductor wafer with an electron beam and uses the difference in solubility to a developer between irradiated portions irradiated with the electron beam and unirradiated portions of the chemical amplification electron beam resist film. Some of the electron beam exposure processes use a positive electron beam resist film and the rest of the electron beam exposure processes use a negative electron beam resist film.

(2) In the semiconductor IC device fabricating method according to the present invention stated in (1), the surface of the chemical amplification electron beam resist film is coated with a conductive polymer film before exposure to an electron beam.

(3) In the method of fabricating a semiconductor IC device according to the present invention stated in (1), an operation for irradiating the chemical amplification electron beam resist film with an electron beam is controlled on the basis of pattern data representing areas inside the actual pattern of an IC.

(4) The semiconductor IC device fabricating method according to the present invention stated in (1) is applied to fabricating application specific ICs.

(5) In the semiconductor IC device fabricating method according to the present invention stated in (2), the conductive polymer film is connected to a grounding terminal to set the surface of the conductive polymer film at a ground potential when irradiating the chemical amplification electron beam resist film with an electron beam.

(6) A semiconductor IC device fabricating method according to the present invention has a plurality of exposure processes including those which form a resist pattern by irradiating a chemical amplification electron beam resist film with an electron beam and those which form a resist pattern by a light projection exposure system using a photomask.

(7) In the semiconductor IC device fabricating method according to the present invention stated in (6), at least one of the processes for fabricating the individual devices forms a resist pattern by the light projection exposure system, the processes for forming wiring lines for connecting the individual devices form resist patterns by the electron beam exposure system using the chemical amplification electron beam resist films.

(8) In the semiconductor IC device fabricating method according to the present invention stated in (6), some of the processes for fabricating the individual devices use a chemical amplification positive electron beam resist film and some of the rest of the same processes use a chemical amplification negative electron beam resist.

(9) In the semiconductor IC device fabricating method according to the present invention stated in (6), a plurality of electron beam exposure processes each form a resist pattern by irradiating the chemical amplification electron beam resist film with an electron beam, some of the electron beam exposure processes use a positive electron beam resist film and the rest of the electron beam exposure processes use a negative electron beam resist film.

(10) In the semiconductor IC device fabricating method according to the present invention stated in (6), the size of the minimum line of the resist pattern formed by irradiating the chemical amplification electron beam resist film with an electron beam is equal to or less than the wavelength of exposure light used by the light projection exposure system.

(11) In the semiconductor IC device fabricating method according to the present invention stated in (7), some of the processes for forming wiring lines for connecting the individual devices use a chemical amplification positive electron beam resist film, and the rest of the same processes use a chemical amplification negative electron beam resist.

(12) In the semiconductor IC device fabricating method according to the present invention stated in (8), the chemical amplification negative electron beam resist film is used for forming the gate electrodes of MISFETs and the chemical amplification positive electron beam resist is used for forming through holes for connecting the MISFETs to wiring lines overlying the MISFETs.

(13) A semiconductor IC device fabricating method according to the present invention forms contact holes for interconnecting wiring lines by using, as a mask, a resist pattern formed by irradiating a chemical amplification electron beam resist film formed on a semiconductor wafer with an electron beam through a process comprising:

(a) a step of depositing an insulating film over individual semiconductor devices formed in a semiconductor wafer, forming a chemical amplification positive electron beam resist film by coating over the insulating film, and coating the chemical amplification positive electron beam resist film with a conductive polymer;

(b) a step of irradiating the chemical amplification positive electron beam resist film with an electron beam on the basis of pattern writing data for writing portions inside the actual pattern of the contact holes with an electron beam;

(c) a step of baking the chemical amplification positive electron beam resist film to promote a resist dissolving reaction augmented by an acid produced by irradiation with the electron beam and serving as a catalyst;

(d) forming a resist pattern by removing the irradiated portions of the chemical amplification positive electron beam resist film by developing; and (e) forming contact holes for interconnecting wiring lines by etching the insulating film using the resist pattern as a mask.

(14) A semiconductor IC device fabricating method according to the present invention forms wiring lines by using, as a mask, a resist pattern formed by irradiating a chemical amplification electron beam resist film formed on a semiconductor wafer with an electron beam through a process comprising:

(a) a step of depositing a conductive film over individual devices formed in a semiconductor wafer, coating the conductive film with a chemical amplification negative electron beam resist film and coating the chemical amplification negative electron beam resist film with a conductive polymer film;

(b) a step of irradiating the chemical amplification negative electron beam resist film with an electron beam on the basis of pattern writing data for writing portions inside the actual pattern of wiring lines;

(c) a step of baking the chemical amplification negative electron beam resist film to promote a cross-linking reaction using an acid produced by irradiation with the electron beam as a catalyst;

(d) a step of forming a resist pattern by removing an unirradiated portion of the chemical amplification negative electron beam resist film by developing; and (e) a step of forming wiring lines by etching the conductive film by using the resist pattern as a mask.

(15) A semiconductor IC device fabricating method has a plurality of electron beam exposure processes each form a resist pattern by irradiating an electron beam resist film formed on a semiconductor wafer with an electron beam and using the difference in solubility to a developer between irradiated portions irradiated with the electron beam and unirradiated portions, some of the plurality of electron beam exposure processes use a positive electron beam resist film and the rest of the electron beam exposure processes using a negative electron beam resist film.

(16) In the semiconductor IC device fabricating method according to the present invention stated in (15), the electron beam resist film is coated with a conductive polymer prior to irradiation with an electron beam.

(17) In the semiconductor IC device fabricating method according to the present invention stated in (15), the electron beam resist film is irradiated with a shaped electron beam having a rectangular cross section or a cross section having the shape of the pattern.

According to the aforesaid means, either the positive electron beam resist or the negative electron beam resist is used according to the size of the area of the portions inside the actual pattern of an IC to reduce time necessary for writing the pattern.

According to the aforesaid means, the conductive polymer film coating the chemical amplification electron beam resist film prevents the charging-up of the chemical amplification electron beam resist film during electron beam writing and stabilizes the chemical amplification electron beam resist film.

According to the aforesaid means, at least one of the individual semiconductor device forming processes employs the light projection exposure system using a photomask and a subsequent wiring pattern forming process employs the electron beam exposure system, which realizes both the reduction of time necessary for exposure and the enhancement of writing accuracy.

Representative features of a second embodiment of the present invention among those concretely described herein will be briefly described below.

(18) A semiconductor IC device fabricating method according to the present invention has a plurality of electron beam exposure processes each forming a resist pattern by irradiating a chemical amplification electron beam resist film formed on a semiconductor wafer with an electron beam and using the difference in solubility to a developer between irradiated portions irradiated with the electron beam and unirradiated portions of the chemical amplification electron beam resist film, some of the plurality of electron beam exposure processes using a positive electron beam resist film and the rest of the electron beam exposure processes using a negative electron beam resist film, and the selection of either the positive electron beam resist film or the negative electron beam resist film is determined by limiting the ratio of the area of irradiated portions to ½ or below when the entire surface of the semiconductor wafer is irradiated with a single electron beam, and on the basis of whether or not irradiated portions of the resist film are to be removed when two or more electron beams are used for irradiating at least a portion of the surface of the semiconductor wafer.

(19) In the semiconductor IC device fabricating method according to the present invention stated in (18), the chemical amplification electron beam resist film is coated with a conductive polymer film prior to irradiating the chemical amplification electron beam resist film with an electron beam.

(20) In the semiconductor IC device fabricating method according to the present invention stated in (18), an electron beam having the shape of a pattern of a predetermined region on the semiconductor wafer corresponding to portions inside the actual pattern of an IC or an electron beam having a different shape and a different size is used.

(21) The semiconductor IC device fabricating method according to the present invention stated in (18) is applied to fabricating application specific ICs.

(22) In the semiconductor IC device fabricating method according to the present invention stated in (19), the conductive polymer film is connected to a grounding terminal to set the surface of the conductive polymer film at a ground potential when irradiating the chemical amplification electron beam resist film with an electron beam.

(23) A semiconductor IC device fabricating method according to the present invention has a plurality of exposure processes each forming a resist pattern by irradiating a resist film formed on a semiconductor wafer with a electron beam, some of the plurality of exposure processes form a conductive polymer film over a chemical amplification electron beam resist film and irradiate the chemical amplification electron beam resist film with an electron beam to form a resist pattern and the rest of the exposure processes form a resist pattern by a light projection exposure system using a photomask.

(24) In the semiconductor IC device fabricating method according to the present invention stated in (23), at least one of the processes for forming individual devices forms a resist pattern by the light projection exposure system, and a process for forming wiring lines over the individual devices forms a resist pattern by an electron beam exposure system using the chemical amplification electron beam resist film.

(25) In the semiconductor IC device fabricating method according to the present invention stated in (23), some of the processes for forming individual devices use a chemical amplification positive electron beam resist film, some of the rest of the same processes use a negative chemical amplification electron beam resist film, the selection of either the positive electron beam resist film or the negative electron beam resist film is determined by limiting the ratio of the area of a portion exposed to an electron beam to ½ or below when the entire surface of the semiconductor wafer is irradiated with a single electron beam, and on the basis of whether or not portions of the resist film exposed to electron beams are to be removed when two or more electron beams are used for irradiating at least a portion of the surface of the semiconductor wafer.

(26) The semiconductor IC device fabricating method according to the present invention stated in (23) has a plurality of electron beam exposure processes each forming a resist pattern by irradiating the chemical amplification electron beam resist film with an electron beam, some of the plurality of electron beam exposure processes use a positive electron beam resist film, the rest of the electron beam exposure processes use a negative electron beam resist, and the selection of either the positive electron beam resist film or the negative electron beam resist film is determined by limiting the ratio of the area of irradiated portion to ½ or below when the entire surface of the semiconductor wafer is irradiated with a single electron beam, and on the basis of whether or not irradiated portions of the resist film are to be removed when two or more electron beams are used for irradiating at least a portion of the surface of the semiconductor wafer.

(27) In the semiconductor IC device fabricating method according to the present invention stated in (23), the size of the minimum line of a resist pattern formed by irradiating the chemical amplification electron beam resist film with an electron beam is equal to or less than the wavelength of exposure light used by the light projection exposure system.

(28) In the semiconductor IC device fabricating method according to the present invention stated in (24), some of the processes for forming wiring lines over the individual devices use a chemical amplification positive electron beam resist film, the rest of the electron beam exposure processes use a chemical amplification negative electron beam resist film, and the selection of either the positive electron beam resist or the negative electron beam resist is determined by limiting the ratio of the area of portions exposed to an electron beam to ½ or below when the entire surface of the semiconductor wafer is irradiated with a single electron beam, and on the basis of whether or not irradiated portions of the resist film are to be removed when two or more electron beams are used for irradiating at least a portion of the surface of the semiconductor wafer.

(29) In the semiconductor IC device fabricating method according to the present invention stated in (25), the chemical amplification negative electron beam resist film is used for forming the gate electrodes of MISFETs, and the chemical amplification positive electron beam resist film is used for forming through holes for connecting the MISFETs to wiring lines overlying the MISFETs.

(30) A semiconductor IC device fabricating method according to the present invention forms contact holes for interconnecting wiring lines by using, as a mask, a resist pattern formed by irradiating a chemical amplification electron beam resist film formed on a semiconductor wafer with an electron beam through a process comprising:

(a) a step of depositing an insulating film over individual devices formed in the semiconductor wafer, forming a chemical amplification positive electron beam resist film over the insulating film by coating and forming a conductive polymer film over the chemical amplification positive electron beam resist film by coating;

(b) a step of irradiating the chemical amplification positive electron beam resist film with an electron beam on the basis of pattern writing data representing portions inside the actual pattern of the contact holes;

(c) a step of baking the chemical amplification positive electron beam resist film to promote a resist dissolving reaction using, as a catalyst, an acid produced in the chemical amplification positive electron beam resist film by irradiating the chemical amplification positive electron beam resist film with the electron beam;

(d) a step of forming a resist pattern by developing the chemical amplification positive electron beam resist film to remove portions of the chemical amplification positive electron beam resist film irradiated with the electron beam; and (e) a step of forming contact holes for interconnecting wiring lines by etching the insulating film using the resist pattern as a mask.

(31) A semiconductor IC device fabricating method according to the present invention forms wiring lines by using, as a mask, a resist pattern formed by irradiating a chemical amplification electron beam resist film formed on a semiconductor wafer with an electron beam through a process comprising:

(a) a step of depositing a conductive film over individual devices formed in a semiconductor wafer, forming a chemical amplification negative electron beam resist film by coating over the conductive film and coating the chemical amplification negative electron beam resist film with a conductive polymer film;

(b) a step of irradiating the chemical amplification negative electron beam resist film with an electron beam on the basis of pattern writing data representing portions inside the actual pattern of wiring lines;

(c) a step of baking the chemical amplification negative electron beam resist film to promote a resist cross-linking reaction using, as a catalyst an acid produced in the chemical amplification negative electron beam resist film by irradiating the chemical amplification negative electron beam resist film with the electron beam;

(d) developing the chemical amplification negative electron beam resist film to form a resist pattern by removing unirradiated portions of the chemical amplification negative electron beam resist film; and (e) etching the conductive film by using, as a mask, the resist pattern to form wiring lines.

(32) A semiconductor IC device fabricating method according to the present invention has a plurality of electron beam exposure processes each forming a resist pattern by irradiating an electron beam resist film formed on a semiconductor wafer with an electron beam and using the difference in solubility to a developer between irradiated portions irradiated with the electron beam and unirradiated portions of the electron beam resist film, some of the plurality of electron beam exposure processes use a positive electron beam resist film, the rest of the electron beam exposure processes use a negative electron beam resist film, the selection of either the positive electron beam resist film or the negative electron beam resist film is determined by limiting the ratio of the area of irradiated portions to ½ or below when the entire surface of the semiconductor wafer is irradiated with a single electron beam, and on the basis of whether or not irradiated portions of the resist film are to be removed when two or more electron beams are used for irradiating at least a portion of the surface of the semiconductor wafer.

(33) In the semiconductor IC device fabricating method according to the present invention stated in (32), the electron beam resist film is coated with a conductive polymer film prior to irradiation with an electron beam.

(34) A semiconductor IC device fabricating method according to the present invention uses a shaped electron beam having a cross section shaped in the shape of the pattern of a predetermined region on a semiconductor wafer or an electron beam having a different shape and a different size.

(35) A semiconductor IC device fabricating method according to the present invention capable of irradiating a semiconductor wafer in a full-wafer electron beam writing mode in which an electron beam having a comparatively large sectional area travels through an electron beam mask provided with at least one aperture having a shape corresponding to a pattern to be formed on the semiconductor wafer or a shape corresponding to the reversal pattern of the pattern to be formed on the semiconductor wafer comprises:

(a) a step of forming a chemical amplification positive electron beam resist film over a first thin film formed on the first major surface of a semiconductor wafer and mounting the semiconductor wafer on the writing stage of an electron beam exposure apparatus;

(b) a step of irradiating the chemical amplification positive electron beam resist film with an electron beam through a first electron beam mask provided with an aperture;

(c) a step of etching the first thin film by using a mask formed by developing the chemical amplification positive electron beam resist film;

(d) a step of removing the chemical amplification positive electron beam resist film;

(e) a step of forming a chemical amplification negative electron beam resist film over a second thin film formed on the first major surface of the semiconductor wafer and mounting the semiconductor wafer on the writing stage of the electron beam exposure apparatus or another electron beam exposure apparatus;

(f) a step of irradiating the chemical amplification negative electron beam resist film with an electron beam traveled through a second electron beam mask provided with an aperture;

(g) a step of etching the second thin film by using a mask formed by developing the chemical amplification negative electron beam resist film; and (h) a step of removing the chemical amplification negative electron beam resist film.

According to the aforesaid means, the selection of either a positive electron beam resist film or a negative electron beam resist film is determined by limiting the ratio of the area of portions exposed to an electron beam to ½ or below when the entire surface of the semiconductor wafer is irradiated with a single electron beam, and on the basis of whether or not portions of the resist film exposed to electron beams are to be removed when two or more electron beams are used for irradiating at least a portion of the surface of the semiconductor wafer. Thus, time necessary for electron beam writing can be reduced by selectively using the positive electron beam resist and the negative electron beam resist.

According to the aforesaid means, the charging-up of the chemical amplification electron beam resist film can be prevented and the chemical amplification electron beam resist film can be stabilized by coating the surface of the chemical amplification electron beam resist film with a conductive polymer film.

According to the aforesaid means, time necessary for exposure can be reduced and writing accuracy can be improved by using the light projection exposure system using a photomask in at least one of the individual device forming processes and using the electron beam exposure system in the subsequent wiring line forming process.

DETAILED DESCRIPTION OF THE PREFERRED EMBODIMENTS

Figure 1:
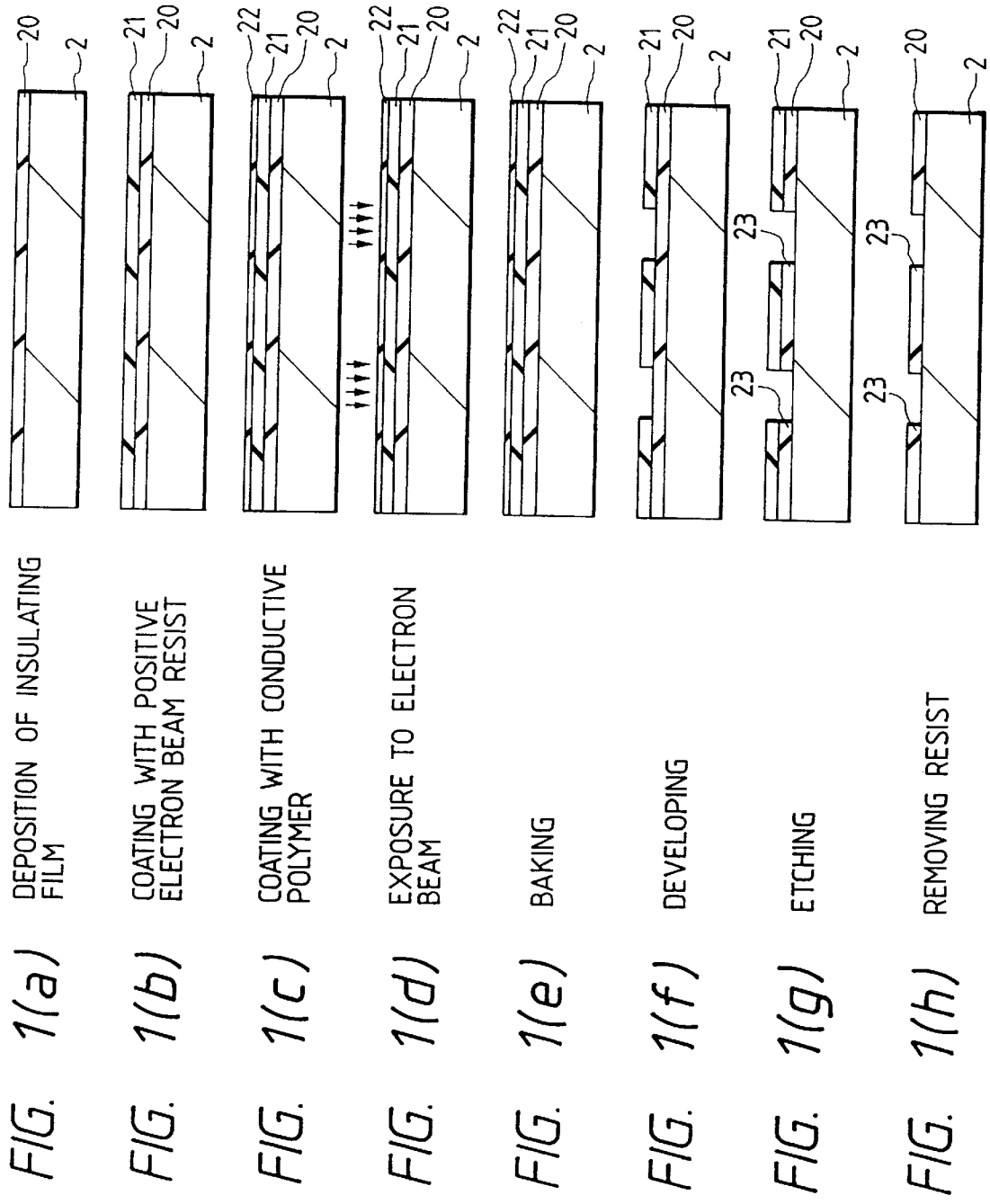
FIGS. 1(a)–1(h) are a schematic typical views of a workpiece of a semiconductor IC device in some different phases of a semiconductor IC device fabricating method in an embodiment according to the present invention.

Preferred embodiments of the present invention will be described hereinafter with reference to the accompanying drawings.

First Embodiment

Referring to FIGS. 1(a)–1(h) showing a workpiece of a semiconductor IC device in different phases of a semiconductor IC device fabricating method in a first embodiment according to the present invention, an insulating film 20, such as a silicon dioxide film, is deposited on the major surface of a semiconductor wafer 2 in which a desired IC is formed, and a chemical amplification positive electron beam resist film 21 is formed over the insulating film 20 by coating. A chemical amplification positive electron beam resist forming the positive electron beam resist film 21 contains, for example, a cresol novolac resin (base resin), tetrahydropyranyl polyvinyl phenol (dissolution inhibitor), i.e., a polyvinyl phenol having hydroxyl groups protected by pyranyl groups to enhance alkali resistance, tri (methanesulphonyloxy) benzene (acid producing agent), a sensitizer and Methyl cellosolve (solvent). The positive electron beam resist film 21 is baked before and after exposure (prebaking and postbaking) to enhance the adhesion of the positive electron beam resist film 21 to the insulating film 20.

Then, a conductive polymer film 22 is formed over the positive electron beam resist film 21 by coating. A conductive polymer forming the conductive polymer film 22 is, for example, "Espacer 100" (Showa Denko).

The conductive polymer film 22 is formed to prevent the charging-up of the semiconductor wafer 2 during exposure, to suppress the aging of the positive electron beam resist film 21 after exposure and to stabilize the positive electron beam resist film 21. If the positive electron beam resist film 21 is not coated with the conductive polymer film 22, an acid produced in the positive electron beam resist film 21 by irradiating the positive electron beam resist film 21 with an electron beam is deactivated with time and the dimensional accuracy of a resist pattern is deteriorated accordingly.

The semiconductor wafer 2 is mounted and positioned on an xy-stage 15 included in an electron beam exposure apparatus.

Figure 2:
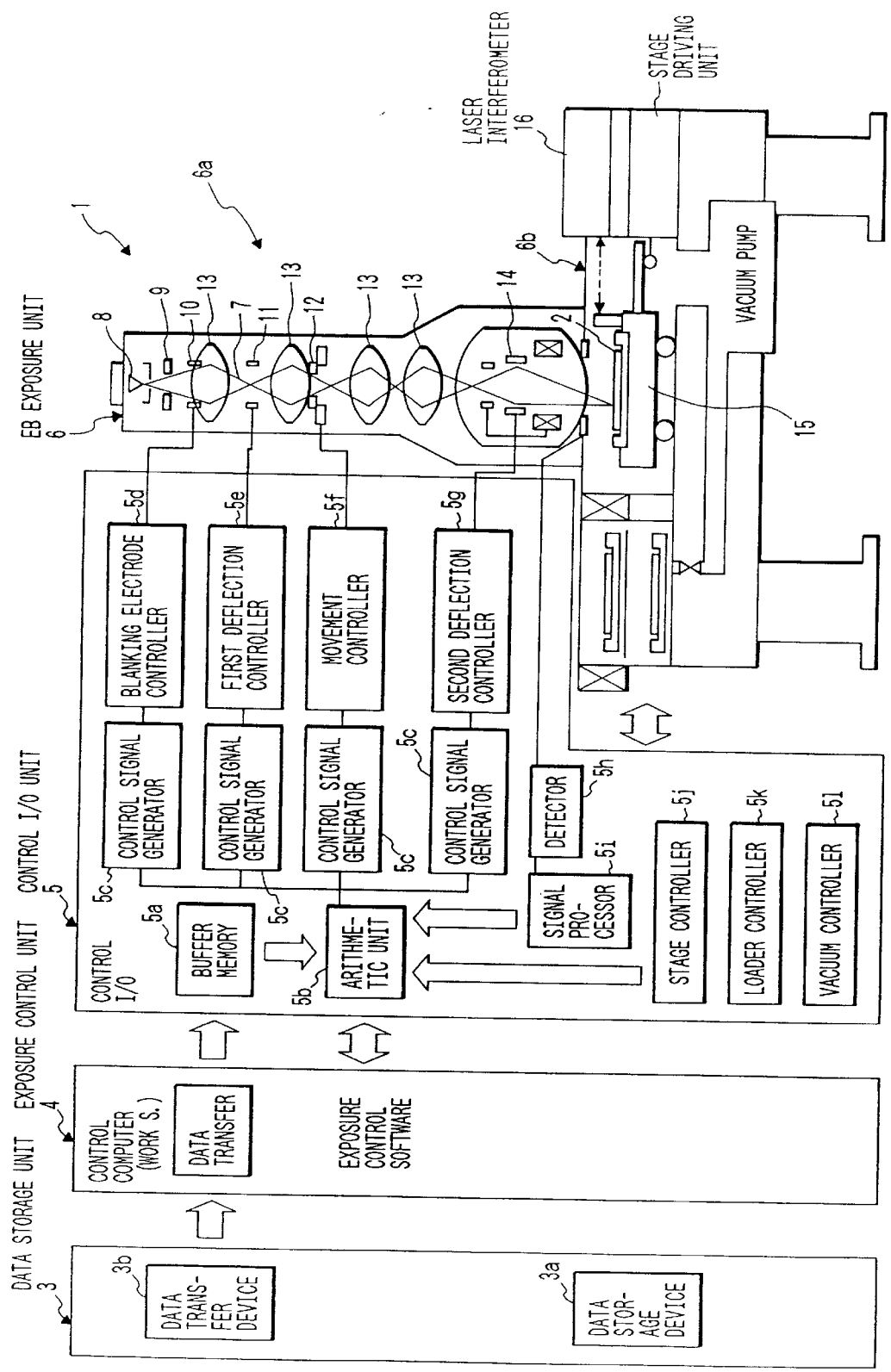
FIG. 2 is a block diagram of an electron beam exposure apparatus employed in the semiconductor IC device fabricating method explained with reference to FIG. 1.
Figure 3A:
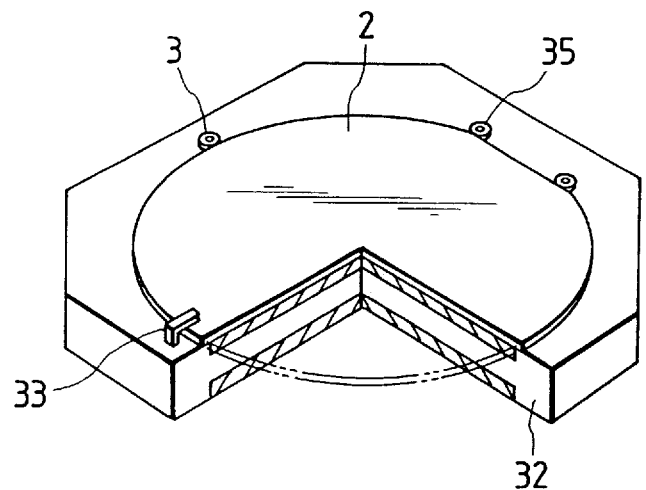
FIGS. 3(a) and 3(b) are a partly sectional perspective view and a fragmentary side view, respectively, of assistance in explaining a method of holding a semiconductor wafer on the electrostatic chuck of the electron beam exposure apparatus of FIG. 2.
Figure 3B:
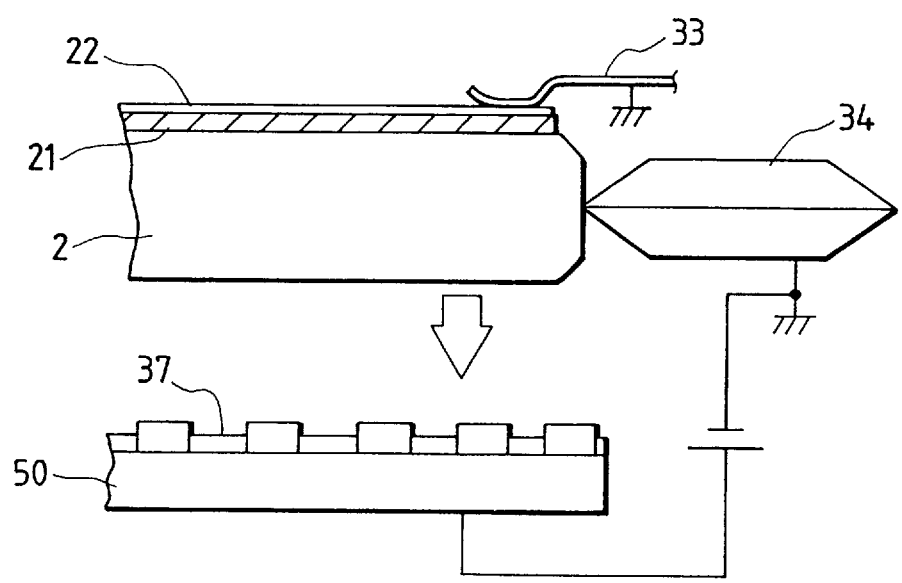
Figure 4:
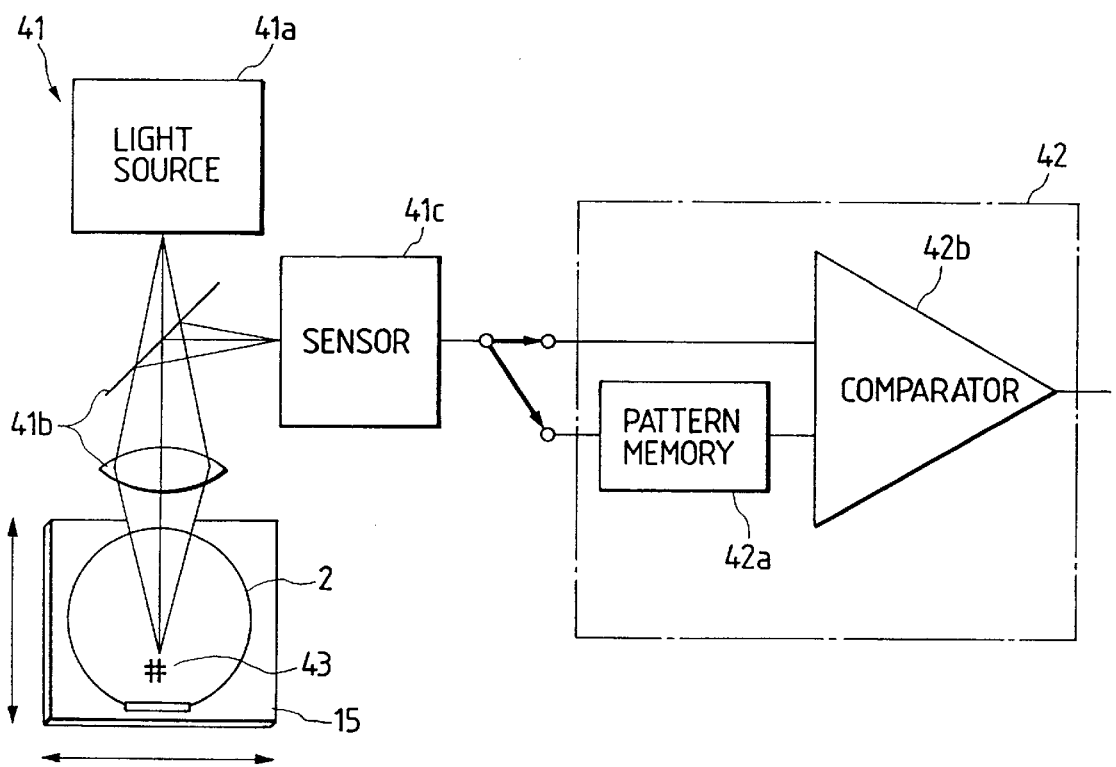
FIG. 4 is a diagrammatic view of a stage positioning mechanism included in the electron beam exposure apparatus of FIG. 2.

FIG. 2 shows the general construction of the electron beam exposure apparatus employed in the first embodiment, FIGS. 3(a) and 3(b) are views of assistance in explaining a method of holding the semiconductor wafer 2 on an electrostatic chuck included in the electron beam exposure apparatus 1, and FIG. 4 is a view showing the construction of a stage position measuring mechanism included in the electron beam exposure apparatus.

Referring to FIG. 2, the electron beam exposure apparatus 1 moves the xy-stage 15 mounted with the semiconductor wafer 2, i.e., a workpiece, continuously, deflects an electron beam 7, i.e., a narrow stream of electrons, for scanning and shuts off the electron beam 7 according to a blanking signal to write a desired IC pattern on the positive electron beam resist film 21 formed on the semiconductor wafer 2. The electron beam exposure apparatus 1 comprises, as principal components, a data storage unit 3, an exposure control unit 4, a control I/O unit 5 and an EB exposure unit 6.

An electron beam source 8 is disposed above the xy-stage 15. Disposed between the electron beam source 8 and the xy-stage 15 is an electron optics system 6a comprising a first deflector 11, a second deflector 14 and electron lenses 13. The electron beam 7 is projected on the semiconductor wafer 2.

The xy-stage is provided with an electrostatic chuck (FIG. 3) for holding the semiconductor wafer 2 on the xy-stage 15, and a stage position measuring mechanism (FIG. 4) for measuring the position of a reference mark 43 formed on the semiconductor wafer 2. The position of the reference mark 43 of the semiconductor wafer 2 is detected by a mark detecting system 41 that detects a reflection signal, i.e., a light beam or the electron beam 7 projected on and reflected by the reference mark 43, and a laser interferometer 16 (FIG. 2) for detecting the position of the xy-stage 15.

The data storage unit 3 for storing writing data comprises a data storage device 3a and a data transfer device 3b. The data storage device 3a is, for example, a magnetic disk, and stores writing control data for controlling a writing operation, and writing data for writing IC patterns including a pattern of a region inside the actual pattern of contact holes, a pattern of a region inside the actual pattern of wiring lines and the like.

The exposure control unit 4 controls the general operations of the electron beam exposure apparatus 1 and is, for example, a high-speed control computer.

Control signals provided by the exposure control unit 4 is transferred through the control I/O unit 5 to the EB exposure unit 6. The control I/O unit 5 comprises a buffer memory 5a, an arithmetic unit 5b, a control signal generator 5c, a blanking electrode controller 5d, a first deflection controller 5e, a movement controller 5f, a second deflection controller 5g, a detector 5h, a signal processor 5i, a stage controller 5j, a loader controller 5k and a vacuum controller 5l.

The coordinates of the reference mark 43 of the semiconductor wafer 2 is determined by scanning the surface of the semiconductor wafer 2 by an electron beam 7 or a light beam prior to electron beam writing and measuring the position of the xy-stage 15 by the laser interferometer 16. The coordinates of the reference mark 43 are transformed into those on, for example, the reference coordinate system of the electron beam exposure apparatus 1, and then the coordinates on the reference coordinate system are stored in the second buffer memory of the arithmetic unit 5b. The second deflection controller 5g is controlled according to pattern information about each pattern. The height of the semiconductor wafer 2 is determined by projecting a light beam obliquely onto the surface of the semiconductor wafer 2 and detecting the light beam reflected by the surface of the semiconductor wafer 2.

The arithmetic unit 5b produces a blanking control signal data for shutting off the electron beam 7, a first deflection control signal data for selecting a desired pattern among those formed on a second mask 12, control signal data for controlling the second mask 12 for movement, and second deflection signal data for controlling the position of the electron beam 7 on the surface of the semiconductor wafer 2 so that desired regions and desired positions are irradiated with the electron beam 7,on the basis of data transferred thereto from the buffer memory 5a, such as writing data, reference mark position data representing the position of the reference mark 43 and stage position data representing the position of the xy-stage 15.

The EB exposure unit 6 comprises the electron optics system 6a, i.e., an electron beam projecting means, and an xy-stage system 6b, i.e., an xy-stage means. The electron optics system 6a comprises the electron beam source 8, a first mask 9, a blanking electrode 10, the first deflector 11, the second mask 12, the electron lenses 13 and the second deflector 14. The electron beam 7 radiated by the electron beam source 8 is projected through the components of the electron optics system 6a onto desired positions on the semiconductor wafer 2 mounted on the xy-stage 15.

The blanking electrode 10 shuts off the electron beam 7 according to irradiation parameter data provided by the arithmetic unit 5b and transferred through the control signal generator 5c and the blanking electrode controller 5d to the blanking electrode 10.

The first deflector 11 deflects the electron beam 7 so that the electron beam 7 traveled that through the electron lens 13 falls at a predetermined position on the second mask 12. A desired pattern among those formed on the second mask 12 is selected on the basis of pattern selection parameter data provided by the arithmetic unit 5b and transferred through the control signal generator 5c and the first deflection controller 5e to the first deflector 11.

The electron lenses 13 focus the electron beam 7, correct the rotation of the electron beam about the optical axis, reduce the sectional shape of the electron beam 7 and focus the electron beam 7 on the semiconductor wafer 2.

The second deflector 14 deflects the electron beam 7 that traveled through the electron lenses 13 so that the electron beam 7 will fall at predetermined positions on the semiconductor wafer 2. The electron beam deflecting operation of the second deflector 14 is controlled on the basis of irradiation parameter data representing regions to be irradiated and the coordinates of positions to be irradiated provided by the arithmetic unit 5b and transferred through the control signal generator 5c and the second deflector controller 5g to the second deflector 14.

The second deflector 14 comprises an electrode deflector for wide deflection, and two stages of electrostatic deflectors for narrow, quick deflection. A position on the semiconductor wafer 2 to be irradiated with the electron beam 7 is controlled on the basis of the sum of a deflection caused by an electromagnetic deflector for wide deflection on the order of, for example, 5 mm$^2$ and a deflection caused by the two electrostatic deflectors for narrow, quick deflection on the order of, for example, 500 μm and 80 μm. Thus, the electron beam 7 can be deflected for wide, quick deflection.

The respective positions of the first mask 9 and the second mask 12 are minutely adjustable. The first mask 9 and the second mask 12 are mounted on mask stages, not shown, respectively. The movement of the second mask 12 is controlled on the basis of movement control parameter data provided by the arithmetic unit 5b and transferred through the control signal generator 5c and the movement controller 5f to a mask stage driving unit to locate a desired pattern of the second mask 12 in an electron beam deflecting region in which the electron beam 7 is deflected. The movement of the first mask 9 is controlled in a similar manner.

As shown in FIGS. 3(a) and 3(b), the semiconductor wafer 2 is positioned by positioning rollers 35 and held fixedly on an electrostatic pallet 32 included in the electrostatic chuck. Although the flatness of the semiconductor wafer 2 is deteriorated with the progress of the fabricating process, the electrostatic chuck is capable of fixedly holding the semiconductor wafer 2 in a flat state even if the semiconductor wafer 2 is warped by about 100.

A current is supplied to the semiconductor wafer 2 fixedly held by the electrostatic chuck through a knife-edged contact pin 34 set in contact with the side surface of the semiconductor wafer 2. The tip of a soft contact pin 33, i.e., a grounding terminal, is in light contact with the conductive polymer film 22 formed on the semiconductor wafer 2 to keep the surface of the conductive polymer film 22 at a ground potential. The soft contact pin 33 is set in very light contact with the conductive polymer film 22 so that the conductive polymer film 22 may be neither damaged nor penetrated by the tip of the soft contact pin 33. A very small portion of charges produced in the conductive polymer film 22 when the same is irradiated with an electron beam is dissipated through the soft contact pin 33 to the ground to prevent the dislocation of the electron beam from a correct irradiating position by the charges.

Referring to FIG. 4, the electron beam exposure apparatus 1 has a positional variation measuring mechanism comprising, as principal components, the mark detecting system 41, i.e., a mark detecting means for detecting the reference mark 43 formed on the semiconductor wafer 2, and a data comparing system 42 for comparing two pieces of input information.

The mark detecting system 41 comprises a light source 41a that emits a light beam, a half mirror, a lens 41b for focusing or deflecting the light beam emitted by the light source 41a, and a sensor 41c for detecting the light beam. The electron beam 7 emitted by the electron beam source 8 shown in FIG. 1 may be used instead of the light beam. The data comparing system 42 comprises a pattern memory for storing information provided by the sensor 41c, and a comparator 42b for comparing pieces of information successively given thereto.

A method of measuring the position of the semiconductor wafer 2 to be carried out by the positional variation measuring mechanism will be described below. The semiconductor wafer 2 is mounted on the xy-stage 15, the light beam emitted by the light source 41a is projected on the reference mark 43 formed on the surface of the semiconductor wafer 2, a reflected light beam is detected by the sensor 41c, and pattern information provided by the sensor 41c is stored in the pattern memory 42a.

Then, the xy-stage 15 is moved in one direction at a given speed, desirably, a writing speed at which the xy-stage 15 moves during electron beam writing or a speed higher than the writing speed, and then the xy-stage 15 is reversed to the initial position. Then, the reference mark 43 is detected again. The information obtained and stored previously in the pattern memory 42a before the xy-stage 15 was moved and the information obtained after the xy-stage 15 has been returned to the initial position are compared by the comparator 42b to determine whether or not the dislocation of the semiconductor wafer 2 from a correct position on the xy-stage 15 is greater than a reference value.

If the repeatability of measurement of the reference mark 43 of the semiconductor wafer 2 is not greater than the reference value, the position of the reference mark 43 is determined by using the electron beam 7. Thus, an IC pattern formed on the semiconductor wafer 2 can be correctly positioned for chips. If the repeatability is greater than the reference value, an error signal is provided, and the semiconductor wafer 2 is removed from the xy-stage or the foregoing operations for chucking the semiconductor wafer 2 by the electrostatic chuck, and detecting the position of the reference mark 43 and moving the xy-stage 15 are repeated, to examine the position of the semiconductor wafer 2 on the xy-stage 15 again.

After the semiconductor wafer 2 has been correctly positioned on the xy-stage, the surface of the semiconductor wafer 2 is irradiated with the electron beam 7 according to the writing data (writing data representing a portion inside the actual pattern of contact holes) stored in the data storage device 3a of the data storage unit 3 and, consequently, the acid producing agent contained in the positive electron beam resist film 21 is hydrolyzed and produces an acid.

Then, the positive electron beam resist film 21 is baked. The acid acts as a catalyst on the dissolution inhibitor to promote a deprotection (depyranyl) reaction. A substance remaining after the deprotection reaction changes into polyvinyl phenol and hence the solubility of portions of the positive electron beam resist film 21 irradiated with the electron beam is enhanced. In some cases, an unnecessary reaction occurs in the interface between the, positive electron beam resist film 21 and the conductive polymer film 22 depending on the combination of properties of the positive electron beam resist forming the positive electron beam resist film 21 and those of the conductive polymer forming the conductive polymer film 22. In such a case, the conductive polymer film 22 is removed by washing before baking.

Then, after the conductive polymer film 22 coating the positive electron beam resist film 21 has been removed by washing, the positive electron beam resist film 21 is developed by using an organic solvent to form a resist pattern.

Then, the insulating film 20 is etched using the resist pattern as a mask to form contact holes 23 for connecting the individual devices of the IC over the individual devices, and then the positive electron beam resist film 21 is removed from the surface of the semiconductor wafer 2.

FIG. 5(a)–5(h) show steps of a semiconductor IC device fabricating method embodying the present invention.

A metal film 24, such as an Al film, is deposited over the major surface of a semiconductor wafer 2 in which a predetermined IC is formed, and a chemical amplification negative electron beam resist film 25 is formed over the metal film 24 by coating. The chemical amplification negative electron beam resist forming the negative electron beam resist film 25 contains, for example, a cresol novolac resin (base resin), melamine (cross-linking agent) tris (bromoacetyl)benzene (acid producing agent) and cyclohexanone (solvent). The semiconductor wafer 2 is baked for prebaking before exposure and for postbaking after exposure to enhance the adhesion of the negative electron beam resist film 25 to the metal film 24.

A conductive polymer film 22 is formed over the negative electron beam resist film 25 by coating to prevent the charging-up of the semiconductor wafer 2 during exposure, and to suppress the aging of the negative electron beam resist film 25 after exposure and to stabilize the negative electron beam resist film 25. If the negative electron beam resist film 25 is not coated with the conductive polymer film 22, an acid produced in the negative electron beam resist film 25 by irradiating the same with an electron beam is deactivated with time and the dimensional accuracy of a resist pattern is deteriorated accordingly.

Then, the semiconductor wafer 2 is positioned on the xy-stage 15 of the electron beam exposure apparatus 1 shown in FIG. 2, and the surface of the semiconductor wafer 2 is irradiated with the electron beam 7 according to writing data representing a portion inside the actual pattern of wiring lines stored in the data storage device 3a of the data storage unit 3. When irradiated with the electron beam 7, the acid producing agent contained in the negative electron beam resist film 25 is hydrolyzed and produces an acid.

Then, the negative electron beam resist film 25 is baked to enhance the solubility of unirradiated portions of the negative electron beam resist film 25, the semiconductor wafer 2 is washed to remove the conductive polymer film 22, and then the negative electron beam resist film 25 is developed using an organic solvent to form a resist pattern. In some cases, an unnecessary reaction occurs in the interface between the negative electron beam resist film 25 and the conductive polymer film 22 depending on the combination of properties of the negative electron beam resist forming the negative electron beam resist film 25 and those of the conductive polymer forming the conductive polymer film 22. In such a case, the conductive polymer film 22 is removed by washing before baking.

Then, the metal film 24 is etched using the resist pattern as a mask to form wiring lines 24A, and then the negative electron beam resist film 25 is removed from the surface of the semiconductor wafer 2.

Since this semiconductor IC device fabricating method uses the positive electron beam resist film 21 and the negative electron beam resist film 25 selectively for the process of forming the contact holes 23 and the process of forming the wiring lines 24A, writing time necessary for writing with the electron beam can be reduced.

The conductive polymer film 22 coating the resist film, such as the positive electron beam resist film 21 or the negative electron beam resist film 25, prevents the charging-up of the resist film during writing with the electron beam and stabilizes the resist film, so that writing accuracy is enhanced.

A semiconductor IC fabricating method embodying the present invention will be described hereinafter as applied to fabricating a bipolar LSI circuit device for use as an ASIC with reference to FIGS. 6 and 7.

Figure 6:
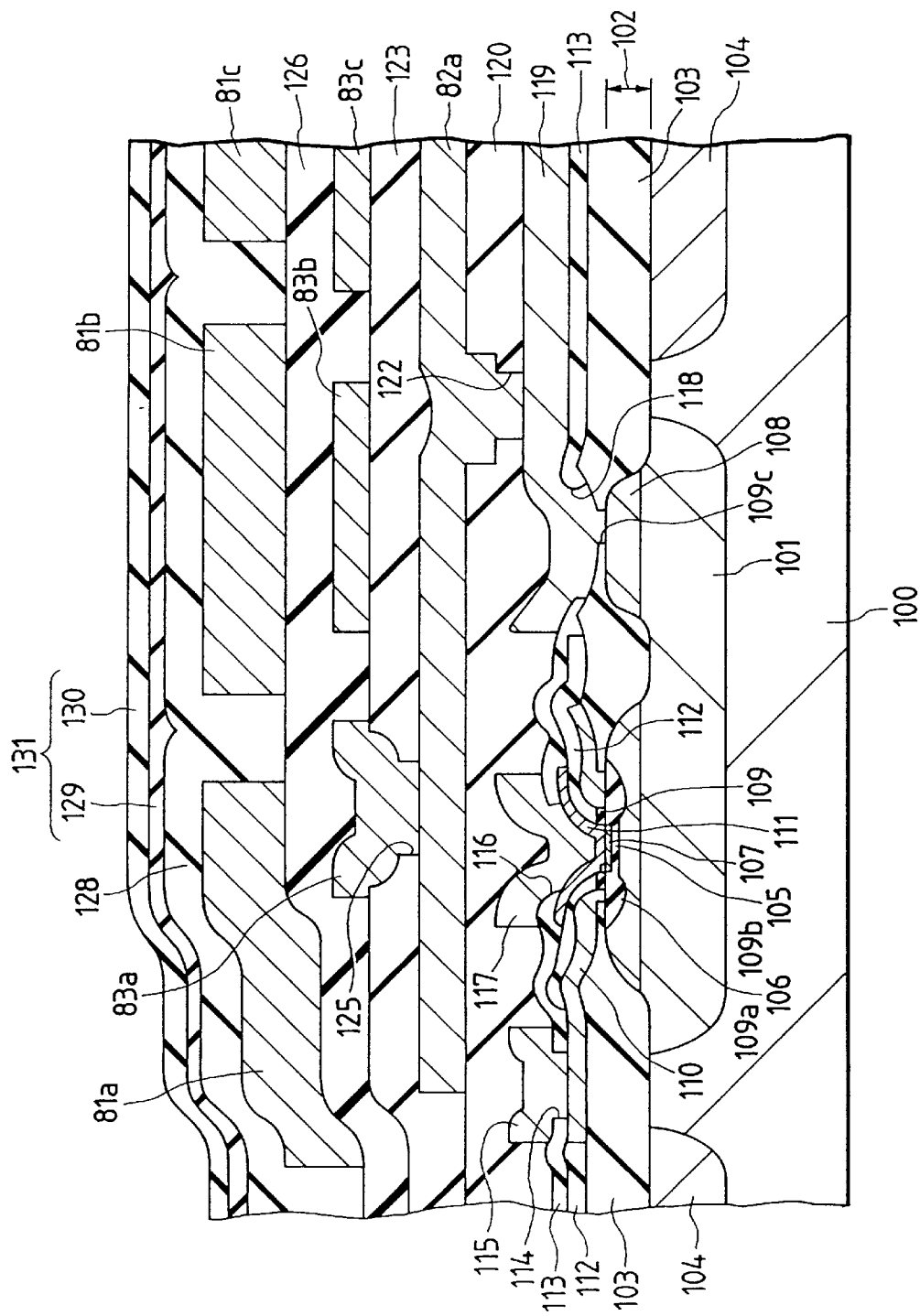
FIG. 6 is a sectional view of an essential portion of a work piece of a semiconductor IC device, of assistance in explaining a semiconductor IC device fabricating method embodying the present invention.
Figure 7:
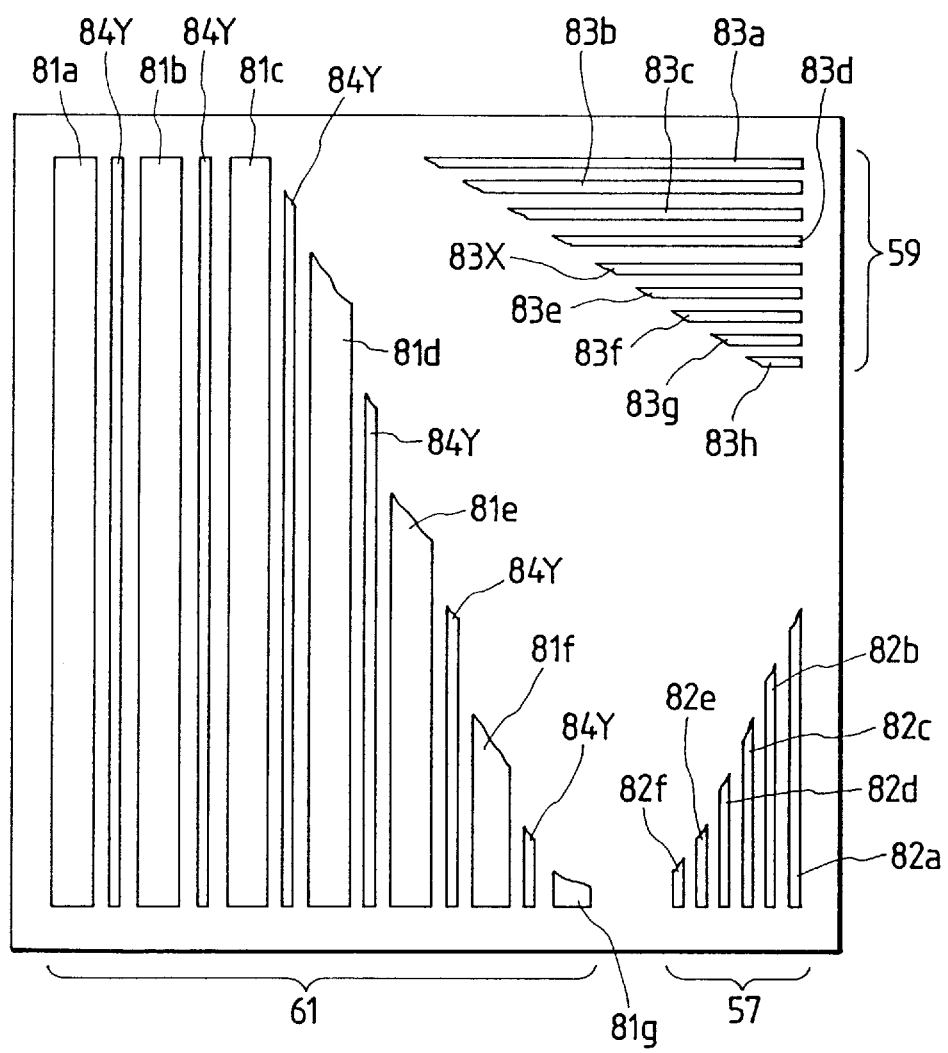
FIG. 7 is a schematic plan view showing the layout of a second, a third and a fourth metal wiring layer included in the semiconductor IC device of FIG. 6.

FIG. 6 is a typical sectional view of an essential portion of a bipolar LSI circuit formed on a semiconductor wafer and FIG. 7 is a typical plan view showing the layout of a second, a third and a fourth wiring layer of the bipolar LSI circuit, in which semiconductor devices are omitted.

Referring to FIG. 6, an n-type region 101 is formed in the surface of a semiconductor wafer 100 of p-type single crystal silicon, and an n-type epitaxial layer 102 is formed on the surface of the semiconductor wafer 100. A field insulating film 103, such as a silicon dioxide film, for isolating the semiconductor devices from each other and isolating the characteristic elements of each semiconductor device from each other is formed in part of the epitaxial layer 102.

Underlying the field insulating film 103 are p-type channel stopper regions 104 formed in the surface of the semiconductor wafer 100. A p-type intrinsic base region 105, a p-type graft base region 106 and an n-type collector region 108 are formed in a portion of the epitaxial layer 102 surrounded by the field insulating film 103. An n-type emitter region 107 is formed in the intrinsic base region 105. The emitter region 107, the intrinsic base region 105, the epitaxial layer 102 underlying the intrinsic base region 105 and the n-type region 101 constitute an npn bipolar transistor.

A light projection exposure system using photomasks is used in processes for constructing the bipolar transistor. An electron beam exposure system in accordance with the present invention is used in processes for forming wiring lines over the bipolar transistor and forming contact holes for connecting the bipolar transistor and the wiring lines, and wiring lines in an upper wiring layer and those in a lower wiring layer.

When the light projection exposure system using photomasks is used for forming the bipolar transistors, the number of wafers processed in unit time is greater than that when the electron beam exposure system is used and hence exposure cost is lower when the light projection system is used than when the electron beam exposure system is used. The use of the electron beam exposure system for forming the wiring lines is suitable for fabricating ICs meeting user's requirements in a short period of time.

As shown in FIG. 6, contact holes 109a, 109b and 109c respectively corresponding to the graft base region 106, the emitter region 107 and the collector region 108 are formed in an insulating film 109 contiguous with the field insulating film 103. The graft base region 106 is connected through the contact hole 109a to a base electrode 110 of a polycrystalline silicon (hereinafter referred to as "p-Si") film. An emitter electrode 111 of a p-Si film is formed on the emitter region 107.

Insulating films 112 and 113, i.e., silicon dioxide films, are formed on the field insulating film 103. Connecting holes 114, 116 and 118 respectively corresponding to the base electrode 110, the emitter electrode 111 and the collector region 108 are formed in the insulating films 112 and 113. The etching process employing the electron beam exposure system, previously described with reference to FIG. 1, namely, the etching process using the positive electron beam resist film as a mask, is used for forming the contact holes 114, 116 and 118.

The etching process employing the electron beam exposure system is capable of efficiently forming the contact holes 114, 116 and 118 even if different types of semiconductor ICs, such as semiconductor ICs for use as ASICs, have the contact holes at different positions. When different types of semiconductor ICs are the same in the respective positions of the contact holes 114, 116 and 118, an etching process employing the light projection exposure system using photomasks, which is used for fabricating transistors, may be used for forming the contact holes 114, 116 and 118.

The base electrode 110 is connected through the contact hole 114 to an Al wiring line 115 of a first wiring layer, the emitter electrode 111 is connected through the contact hole 116 to a wiring line 117 of the first wiring layer, and the collector region 108 is connected through the contact holes 118 and 109c to a wiring line 119 of the first wiring layer.

Figure 5:
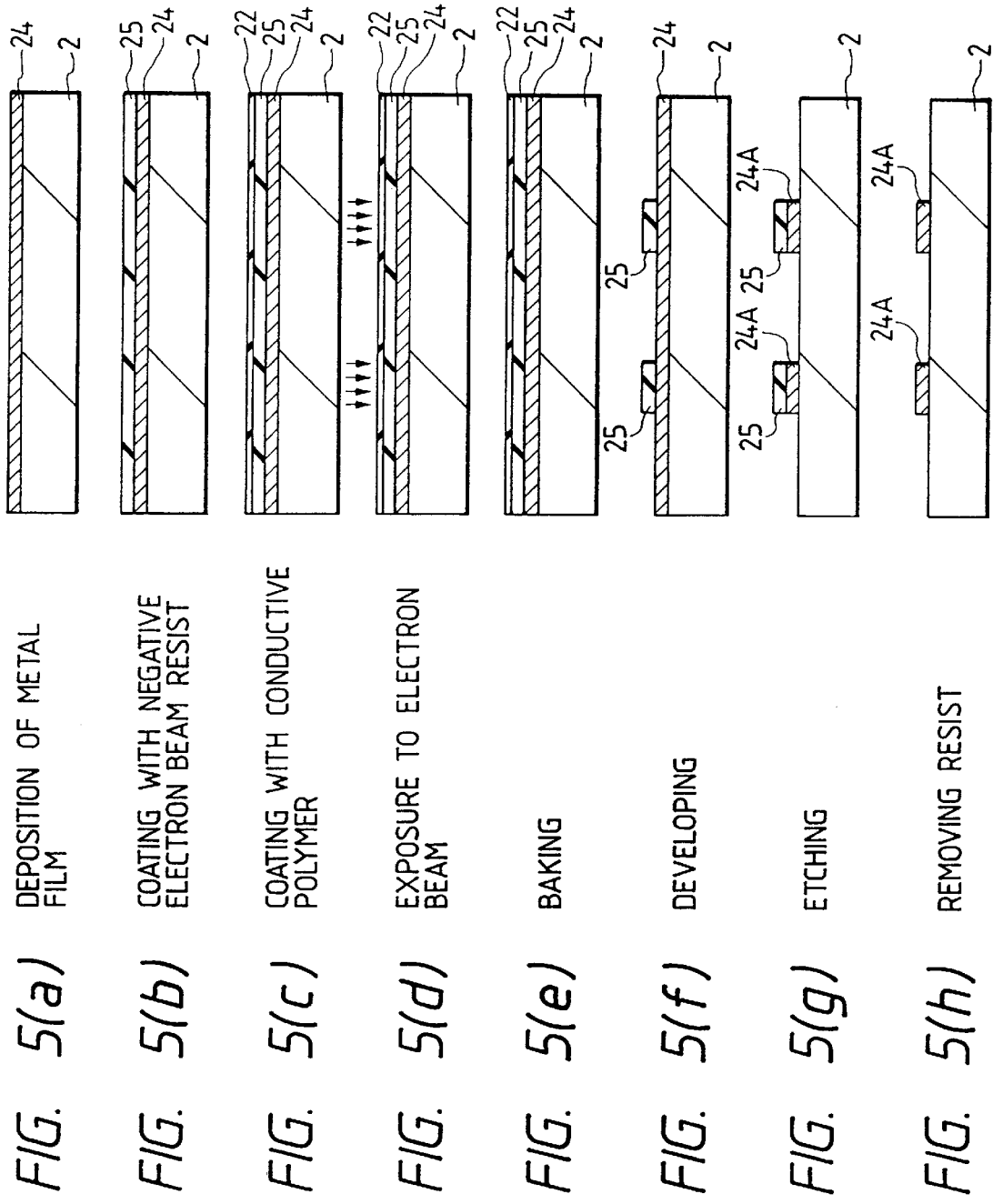
FIGS. 5(l)–5(h) are schematic views of a workpiece of a semiconductor IC device in some different phases of a semiconductor IC device fabricating method embodying the present invention.

The wiring lines 115, 117 and 119 of the first wiring layer are formed by the method previously described with reference to FIG. 5, namely, the method that etches the metal film using the negative electron beam resist film as a mask. In this wiring line forming process, the influence of charging-up during writing is insignificant because the metal film for forming the first wiring layer underlies the negative electron beam resist film. Therefore, the conductive polymer film overlying the negative electron beam resist film functions principally for stabilizing the negative electron beam resist film.

A layer insulating film 120 formed by superposing a silicon nitride film and a SOG (spin-on glass) film overlies the first wiring layer having the wiring lines 115, 117 and 119. The SOG film is formed by a spin coating process, and the silicon nitride film and the silicon dioxide film are deposited by a plasma CVD process.

A second wiring layer, such as an Al film, having a wiring line 82a is formed on the layer insulating film 120. The wiring lines of a wiring line group 57 of the second wiring layer are extended mainly vertically as viewed in FIG. 7. For example, the wiring lines 82a to 82f of the wiring line group 57 of the second wiring layer are 3.5 μm in width and are arranged at a pitch of 5 μm. The wiring lines 82a to 82f are formed by etching using a negative electron beam resist film as a mask.

The wiring line 82a of the second wiring layer is connected through a stepped contact hole 122 formed in the layer insulating film 120 to the wiring line 119 of the first wiring layer. The stepped contact hole 122 improves the step coverage of the wiring line 82a of the second wiring layer within the contact hole 122. The contact hole 122 is formed by etching using a positive electron beam resist film as a mask.

A layer insulating film 123 similar to the layer insulating film 120 is formed on the second wiring layer having the wiring line 82a. A third wiring layer having wiring lines 83a, 83b and 83c formed by etching, for example, an Al film is formed on the layer insulating film 123. The wiring lines of a wiring line group 59 of the third wiring layer are extended mainly horizontally as viewed in FIG. 7. For example, the wiring lines 83a to 83h of the wiring line group 59 of the third wiring layer are 3.5 μm in width and are arranged at a pitch of 5 μm for mutual connection according to necessity. Spare wiring lines 83X are formed every fifth wiring lines of the wiring line group 59 of the third wiring layer. The wiring lines 83a to 83f and 83X are formed by etching using a negative electron beam resist film as a mask.

The wiring line 83a of the third wiring layer is connected through a contact hole 125 formed in the layer insulating film 123 to the wiring line 82a of the second wiring layer. The contact hole 125 is formed by etching using a positive electron beam resist film as a mask.

A layer insulating film 126 similar to the layer insulating films 120 and 123 is formed over the third wiring layer having the wiring lines 83a, 83b and 83c, and a fourth wiring layer having wiring lines 81a, 81b and 81c of, for example, an Al film is formed on the layer insulating film 126.

The wiring lines of a wiring line group 61 of the fourth wiring layer are extended vertically as viewed in FIG. 7. The wiring lines 81a to 81g of the wiring line group 61 of the fourth wiring layer are power lines or reference voltage lines (VESL=-4 V, VEE =-3 V, VTT=-2 V and VCC1, VCC2 and VCC3=0 V for an ECL circuit). The widths of the wiring lines 81a to 81g are in the range of 50 to 200 μm. The wiring lines 81a to 81g are 2 μm in thickness, and the wiring space between the wiring lines 81a to 81g is 2 μm. Wiring lines 84Y are spare wiring lines of 10 μm in width. The wiring lines 81a to 81g and 84Y are formed by etching using a negative electron beam resist film as a mask.

An insulating film 128 is formed over the fourth wiring layer having the wiring lines 81a, 81b and 81c to flatten the surface of the workpiece. The insulating film 128 is a silicon dioxide film formed by a bias sputtering process or a combination of a plasma CVD process and a sputter etching process. The insulating film 128 may be a silicate glass film, such as a PSG (phosphosilicate glass) film, a BSG (borosilicate glass) film or a BPSG (borophosphosilicate glass) film formed by a combination of an atmospheric pressure CVD process and a sputter etching process. Grooves between the wiring lines 81a, 81b and 81c of the fourth wiring layer are filled up with the insulating film 128 and the insulating film 128 has a substantially flat surface.

A silicon nitride film 129 is deposited over the insulating film 128 by a plasma CVD process, and a silicon dioxide film 130 is deposited over the silicon nitride film 129 by a plasma CVD process. The silicon nitride film 129 and the silicon dioxide film 130 constitute a passivation film 131 for protecting the surface of the semiconductor wafer 100.

Since the insulating film 128 has a flat surface as mentioned above, the silicon nitride film 129 is comparatively uniform in thickness and quality and hence the passivation film 131 has a high moisture resistance to inhibit the permeation of moisture. Accordingly, the LSI circuit may be packaged in either a hermetic sealing package or a nonhermetic sealing package.

A semiconductor IC device fabricating method embodying the present invention will be described as applied to fabricating a twin well CMOS static RAM (SRAM) with reference to FIGS. 8 to 14.

Figure 8:
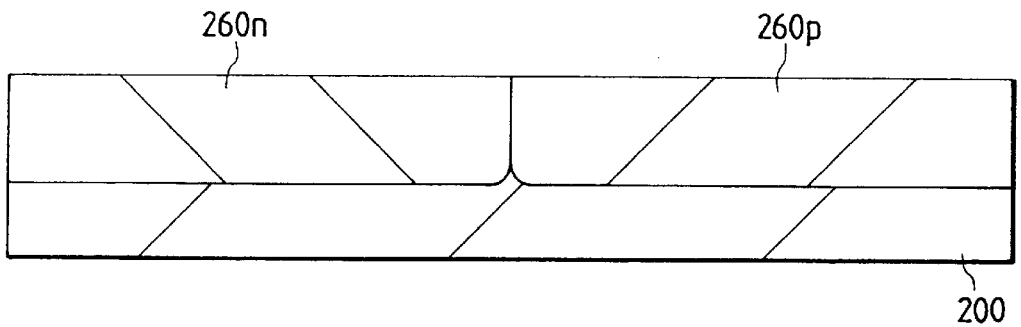
FIG. 8 is a typical sectional view of an essential portion of a workpiece, of assistance in explaining a semiconductor IC device fabricating method embodying the present invention.

FIG. 8 is a view of assistance in explaining a twin well forming process for forming an n-type well and a p-type well. Shown in FIG. 8 are a semiconductor wafer 200 of n⁻-type single crystal silicon, an n-type well 260n and a p-type well 260p.

Figure 9:
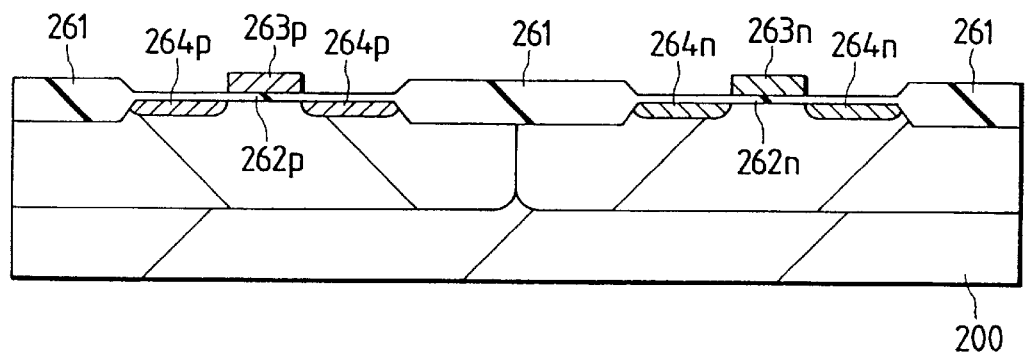
FIG. 9 is a typical sectional view of an essential portion of a workpiece, of assistance in explaining a semiconductor IC device fabricating method embodying the present invention.

FIG. 9 is a view of assistance in explaining a gate forming process subsequent to the twin well forming process, and a source/drain forming process for forming the source and the drain of each MOSFET by ion implantation in a self-alignment mode using a gate formed by the gate forming process. Shown in FIG. 9 are a field oxide film 261, gate oxide films 262n and 262p, gate electrodes 263n and 263p of p-Si, an n-type source 264n, an n-type drain 264n, a p-type source 264p and a p-type drain 264p.

Figure 10:
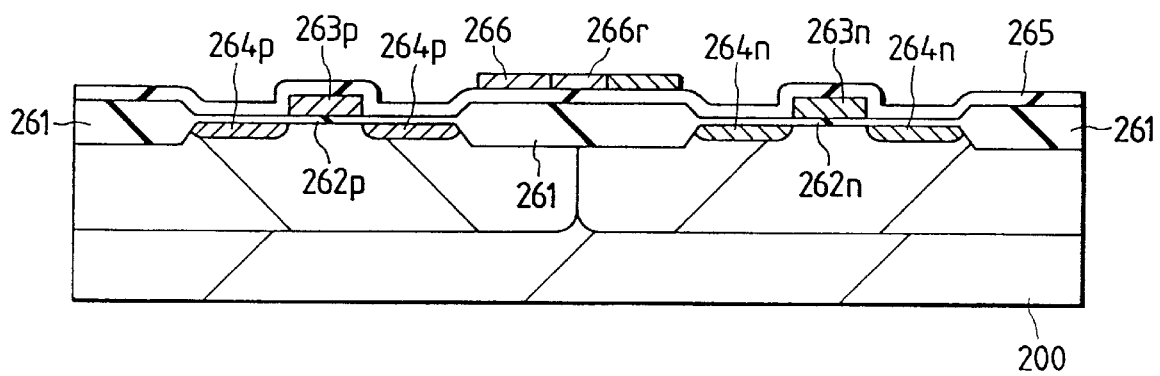
FIG. 10 is a typical sectional view of an essential portion of a workpiece, of assistance in explaining a semiconductor IC device fabricating method embodying the present invention.

FIG. 10 is a view of assistance in explaining a layer insulating film forming process, and a process for forming p-Si wiring lines of a second wiring layer and high-resistance resistors. Shown in FIG. 10 are a layer insulating film 265, a p-Si wiring line 266, a p-Si high-resistance resistor 266r serving as a negative resistance of the memory cells of the SRAM.

Figure 11:
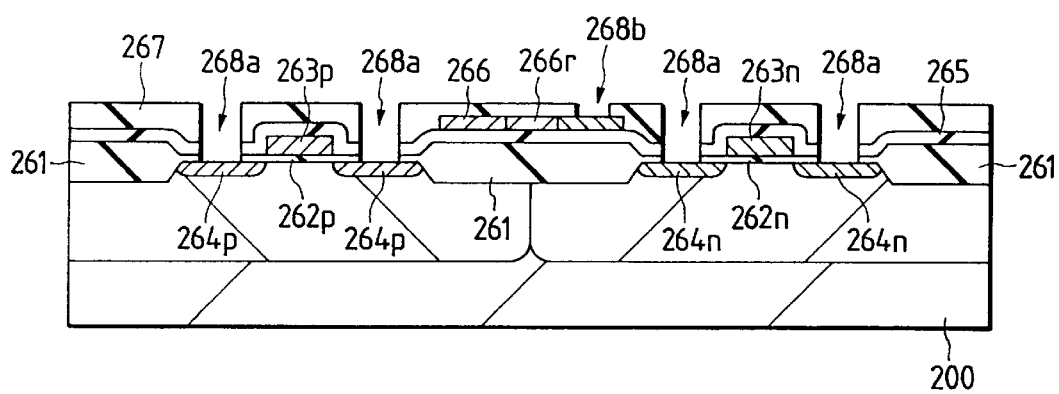
FIG. 11 is a typical sectional view of an essential portion of a workpiece, of assistance in explaining a semiconductor IC device fabricating method embodying the present invention.

FIG. 11 is view of assistance in explaining a flattening process using SOG and a contact hole forming process. Shown in FIG. 11 are a SOG film 267, contact holes 268a reaching the semiconductor wafer 200, and a contact hole 268b through which the p-Si wiring line 266 is connected to an overlying layer.

Figure 12:
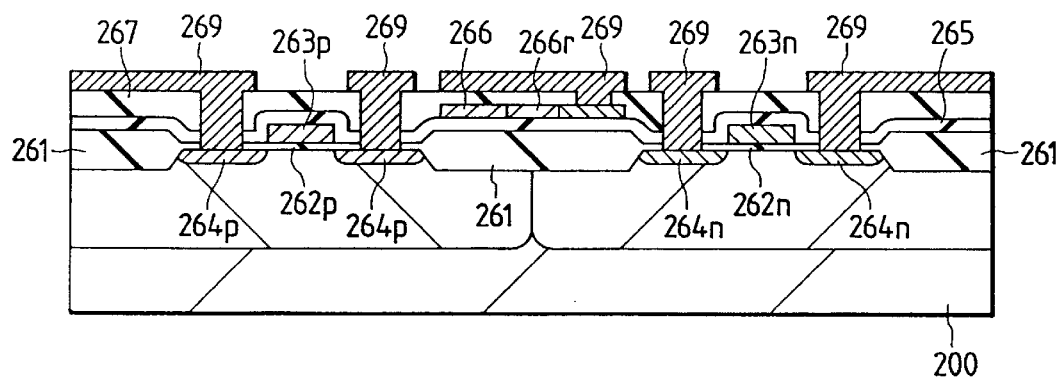
FIG. 12 is a typical sectional view of an essential portion of a workpiece, of assistance in explaining a semiconductor IC device fabricating method embodying the present invention.

FIG. 12 is a view of assistance in explaining a first wiring layer forming process. In FIG. 12, indicated at 269 are Al wiring lines of a first wiring layer.

Figure 13:
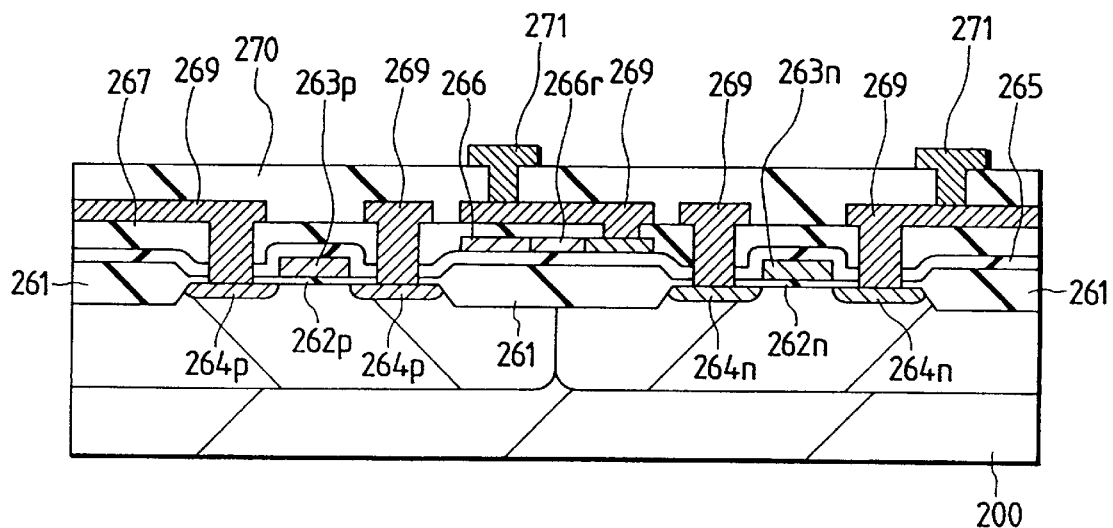
FIG. 13 is a typical sectional view of an essential portion of a workpiece, of assistance in explaining a semiconductor IC device fabricating method embodying the present invention.

FIG. 13 is a view of assistance in explaining a layer insulating film forming process for forming a layer insulating film over the wiring lines 269 of the first wiring layer and a second wiring layer forming process. In FIG. 13, indicated at 270 is a layer insulating film formed over the Al wiring lines 269 of the first wiring layer, and at 271 are Al wiring lines of a second wiring layer connected through the contact holes to the wiring lines 269 of the first wiring layer.

Figure 14:
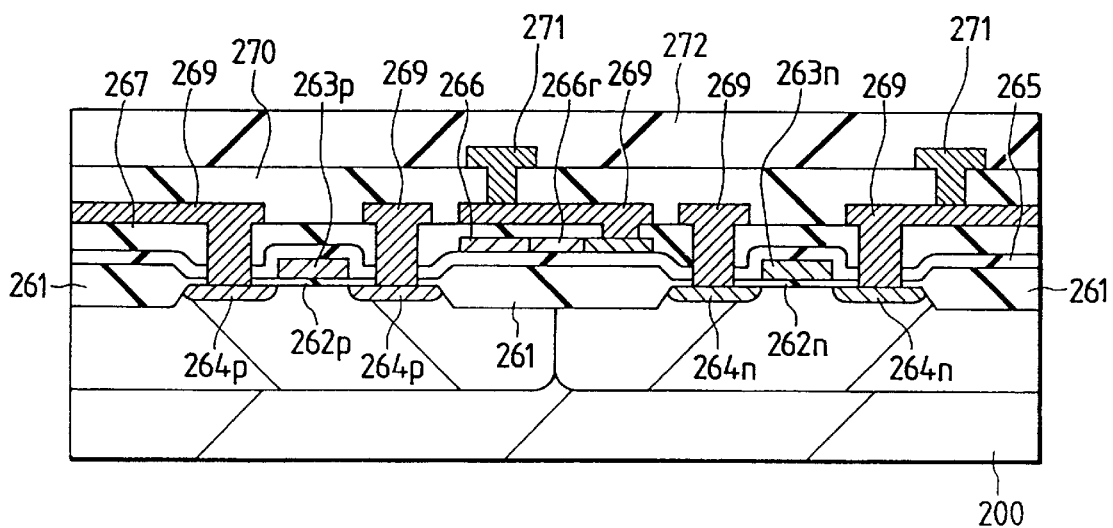
FIG. 14 is a typical sectional view of an essential portion of a workpiece, of assistance in explaining a semiconductor IC device fabricating method embodying the present invention.

FIG. 14 is a view of assistance in explaining a final passivation film forming process for forming a final passivation film over the wiring lines 271 of the second wiring layer. In FIG. 14, indicated at 272 is a final passivation film.

Figure 15:
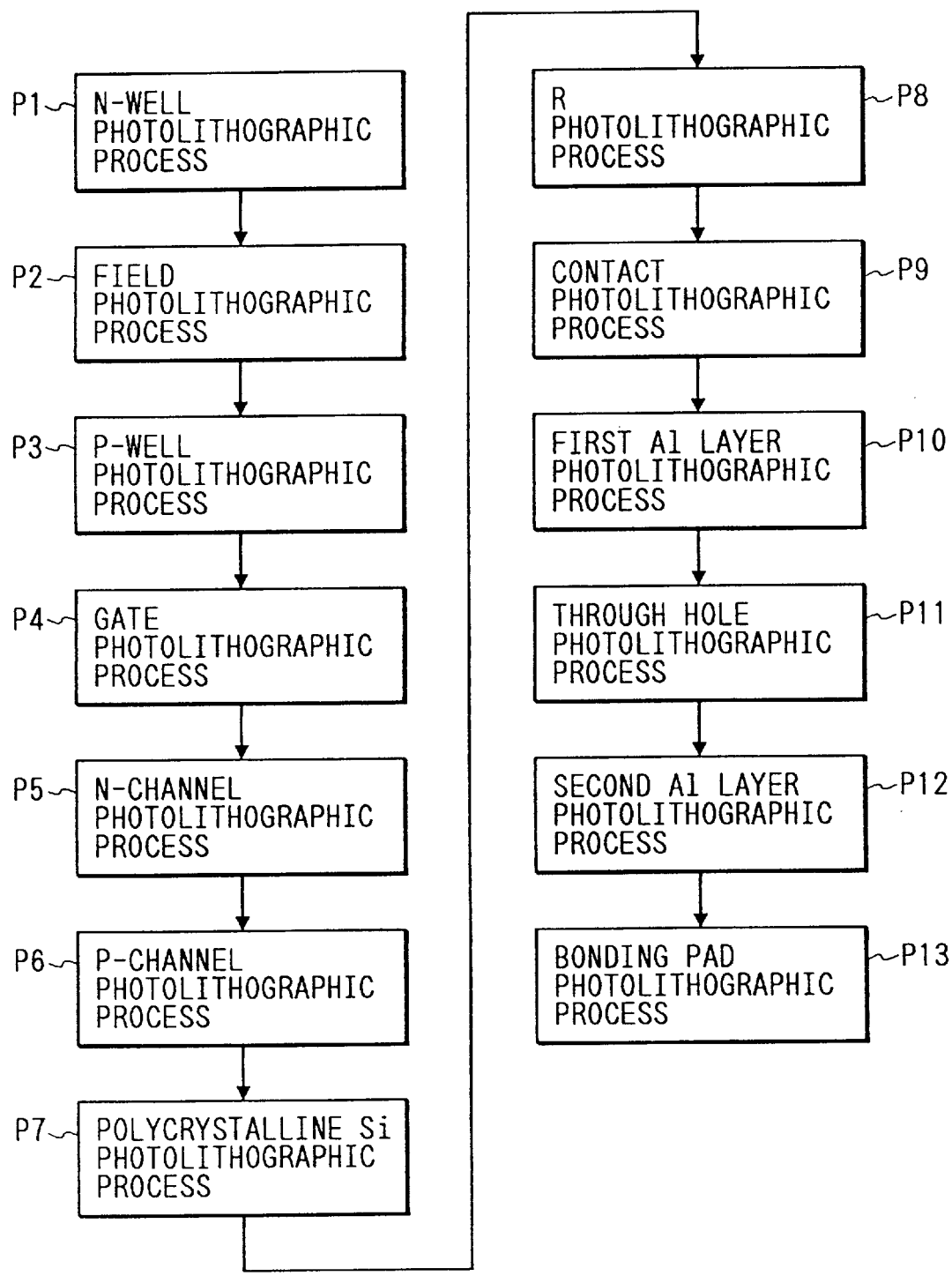
FIG. 15 is a flow chart of a photoresist film forming procedure included in a semiconductor IC device fabricating method embodying the present invention.

FIG. 15 is a flow chart of assistance in explaining photolithographic processes, namely, exposure processes, included in the process of fabricating the SRAM. In FIG. 15, an n-well photolithographic process P1 forms a photoresist pattern covering portions of the surface of the semiconductor wafer other than that in which the n-type well 260n is formed, by processing a silicon nitride film. A field photolithographic process P2 forms a photoresist film over the silicon nitride film and patterns the photoresist film to pattern the silicon nitride film so that the active regions of n-type channels and p-type channels are covered.

A p-well photolithographic process P3 patterns a photoresist film covering the n-type well 260n to form a channel stop region for the p-type well 260p. A gate photolithographic process P4 patterns a photoresist film formed over a polycrystalline film formed over the entire surface of the semiconductor wafer to pattern the gate electrodes 263n and 263p.

An n-channel photolithographic process P5 patterns a photoresist film on the side of the p-type channel for the ion-implantation of an n-type impurity into the n-type channel using the gate electrode 263n as a mask. A p-channel photolithographic process P6 patterns a photoresist film on the side of the n-type channel for the ion-implantation of a p-type impurity into the p-type channel using the gate electrode 263p as a mask.

A polycrystalline Si photolithographic process P7 patterns a photoresist film formed over a p-Si film over the entire surface to pattern a second p-Si film for forming the wiring lines 266 or the high-resistance resistor 266r (FIG. 10). An R photolithographic process P8 patterns a photoresist film that forms a mask covering the high-resistance resistor 266r (FIG. 10) for the ion-implantation of an impurity into regions other than that corresponding to the high-resistance resistor 266r.

A contact photolithographic process P9 forms a photoresist film and patterns the photoresist film by a positive process to form a photoresist pattern for forming the contact holes 268a and 268b (FIG. 11) for connecting the semiconductor wafer 200, the sources and drains 264n and 264p, the first p-Si layer and the second p-Si layer to the wiring lines 269 of the first wiring layer. A first Al layer photolithographic process P10 forms a photoresist pattern for patterning a first Al wiring layer to form the wiring lines 269.

A through hole photolithographic process P11 forms a photoresist pattern for forming contact holes for connecting the wiring lines 269 of the first Al wiring layer and the wiring lines 271 of a second Al wiring layer. A second Al layer photolithographic process P12 forms a photoresist pattern for patterning the second Al wiring layer to form the wiring lines 271. A bonding pad photolithographic process P13 forms a photoresist film over the final passivation film 272 excluding portions of the final passivation film 272 corresponding to bonding pads to form openings of about 100 μm square in the final passivation film 272.

Since the minimum sizes of shapes to be formed by the n-well photolithographic process P1, the n-channel photolithographic process P5, the p-channel photolithographic process P6 and the bonding pad photolithographic process P13 are comparatively large, the electron beam exposure system need not be applied to those processes. The electron beam exposure system in accordance with the present invention is applied to the rest of the processes.

The gate photolithographic process P4 uses a chemical amplification negative electron beam resist for forming the gate electrodes 263n and 263p, and a chemical amplification positive electron beam resist for forming the contact holes 268a and 268b for connecting the sources and drains 264n and 264p to the wiring lines 269 of the first Al wiring layer, whereby the gate length of the gate electrodes 263a and 263p and the diameter of the contact holes 268a and 268b can be reduced to sizes not greater than the wavelength, for example, on the order of 0.3 μm, of exposure light used by the light projection exposure system.

Although the semiconductor IC device fabricating method in the first embodiment according to the present invention has been specifically described, naturally, the present invention is not limited in its practical application to the foregoing embodiment and many changes and variations may be made therein without departing from the gist of the present invention.

Although the first embodiment has been described as applied to wiring line forming processes and contact hole forming processes, the present invention is applicable also to IC device fabricating processes.

The following are representative effects of the first embodiment of the present invention.

Time necessary for electron beam writing can be reduced because either a chemical amplification positive electron beam resist or a chemical amplification negative electron beam resist is used selectively according to the IC fabricating process in forming an IC pattern by using a resist pattern formed by irradiating a chemical amplification electron beam resist film formed on a semiconductor wafer with an electron beam as a mask and, consequently, the use of chemical amplification electron beam resists realizes electron beam direct writing at a high throughput.

The conductive polymer film formed over the chemical amplification electron beam resist film prevents the charging-up of the chemical amplification electron beam resist film during electron beam writing and stabilizes the chemical amplification electron beam resist film, which enables high-accuracy electron beam direct writing using the chemical amplification electron beam resist film.

Second Embodiment

FIGS. 16(a)–16(h) are flow charts of some of the processes of a semiconductor IC device fabricating method in a second embodiment according to the present invention.

First, an insulating film 20, such as a silicon dioxide film, is formed over the major surface of a semiconductor wafer 2 in which a predetermined IC is formed, and a chemical amplification positive electron beam resist film 21 is formed over the insulating film 20 by coating. A chemical amplification positive electron beam resist forming the chemical amplification positive electron beam resist film 21 contains, for example, a cresol novolac resin (base resin), tetrahydropyranyl polyvinyl phenol (dissolution inhibitor), i.e., a polyvinyl phenol having hydroxyl groups protected by pyranyl groups to enhance alkali resistance, tri (methanesulphonyloxy)benzene (acid producing agent), a sensitizer, and Methyl cellosolve (solvent). The positive electron beam resist film 21 is baked before and after exposure for prebaking and postbaking to enhance the adhesion of the positive electron beam resist film 21 to the insulating film 20.

Then, a conductive polymer film 22 is formed over the positive electron beam resist film 21 by coating. A conductive polymer forming the conductive polymer film 22 is, for example, "Espacer 100" (Showa Denko).

The conductive polymer film 22 is formed to prevent the charging-up of the semiconductor wafer 2 during exposure, to reduce the aging of the positive electron beam resist film with time after exposure and to stabilize the positive electron beam resist film 21. If the positive electron beam resist film 21 is not coated with the conductive polymer film 22, an acid produced in the positive electron beam resist film 21 by irradiating the same with an electron beam is deactivated with time and the dimensional accuracy of the resist pattern is deteriorated accordingly.

Then, the semiconductor wafer 2 is mounted on an xy-stage included in an electron beam exposure apparatus and a desired pattern is written. The electron beam exposure apparatus and a pattern writing method will be described in detail later.

The semiconductor wafer 2 is positioned accurately on the xy-stage, and the surface of the semiconductor wafer 2 is irradiated with an electron beam according to writing data (writing data representing portions inside the actual pattern of contact holes). Then, the acid producing agent contained in the positive electron beam resist film 21 is hydrolyzed and produces an acid.

Then, the positive electron beam resist film 21 is baked. The acid acts as a catalyst on the dissolution inhibitor to promote a deprotection (depyranyl) reaction. A substance remaining after the deprotection reaction changes into polyvinyl phenol and hence the solubility of portions of the positive electron beam resist film 21 irradiated with the electron beam is enhanced. In some cases, an unnecessary reaction occurs in the interface between the positive electron beam resist film 21 and the conductive polymer film 22 depending on the combination of properties of the positive electron beam resist forming the positive electron beam resist film 21 and those of the conductive polymer forming the conductive polymer film 22. In such a case, the conductive polymer film 22 is removed by washing before baking.

Then, after the conductive polymer film 22 has been removed by washing the semiconductor wafer 2, the positive electron beam resist film 21 is developed by using an organic solvent to form a resist pattern.

Then, the insulating film 20 is etched using the resist pattern as a mask to form contact holes 23 for connecting the individual devices of the IC over the individual devices, and then the positive electron beam resist film 21 is removed from the surface of the semiconductor wafer 2.

Figure 16:
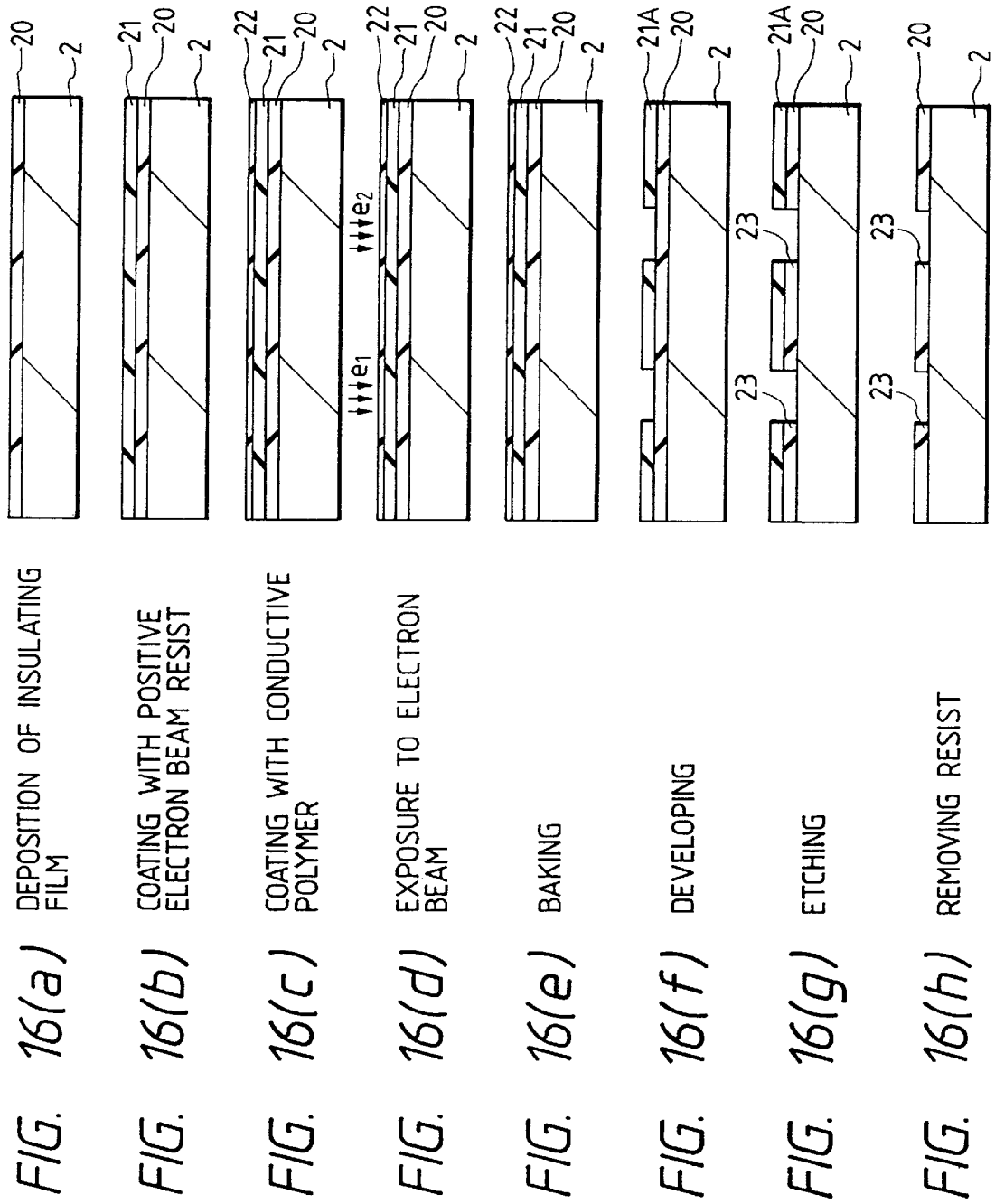
FIGS. 16(a)–16(h) are typical views of a workpiece in different phases of a semiconductor IC device fabricating method embodying the present invention.

In the process for irradiating the semiconductor wafer with an electron beam, restrictions are placed on the electron beam resist to be used depending on whether a single shaped electron beam is used or whether two shaped electron beams are used. That is, when a single shaped electron beam is used, regions e1 and e2 shown in FIG. 16 are irradiated successively and not simultaneously, the ratio of writing area of the contact holes for connecting wiring lines is 1/10 or below when a positive resist is used and hence the throughput of the writing process can be increased. If a negative resist is used, the ratio of writing area is 9/10 or above, which increases time necessary for writing greatly entailing the deterioration of pattern writing accuracy.

When two shaped electron beams are used for exposure in at least some of the processes, the regions e2 and e2 shown in FIG. 16 are irradiated simultaneously, and either a positive resist or a negative resist is used simply depending on whether or not irradiated portions of the resist film are to be removed. When two shaped electron beams are used, which will be described later, a beam transmitting mask (full transfer mask) having patterns for irradiating two or more regions can be made to irradiate desired regions with electron beams, a positive resist can be used and the full transfer mask enables further quick writing. If a negative resist is used, a beam transmitting mask having patterns for irradiating two or more regions cannot be made.

Figure 17:
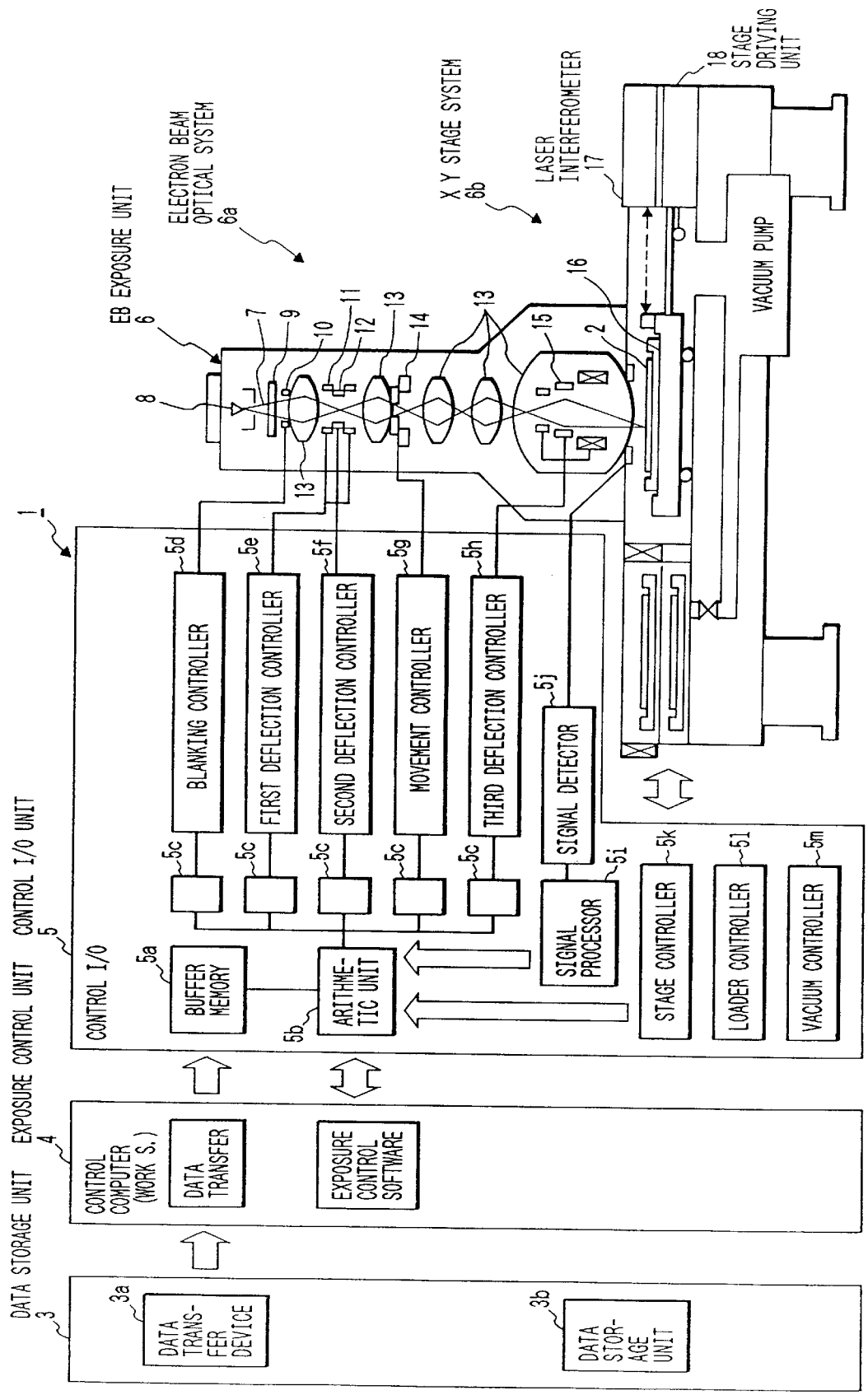
FIG. 17 is a block diagram of an electron beam exposure apparatus employed in the semiconductor IC device fabricating method illustrated in FIG. 16.

FIG. 17 shows a pattern exposure system using an electron beam, employed in carrying out this embodiment. An electron beam exposure apparatus 1 writes a predetermined IC pattern on an electron beam resist film formed on the semiconductor wafer 2 by controlling the movement of the semiconductor wafer 2, the deflection of an electron beam 7 and the blanking of the electron beam 7 while an xy-stage is moved continuously. The electron beam exposure apparatus 1 comprises, as principal components, a data storage unit 3, a writing control unit 4, a control I/O unit 5 and an EB exposure unit 6.

The writing control unit 3 controls the general operations of the electron beam exposure apparatus 1 and employs, for example, a high-speed control computer.

The control I/O unit 5 receives control signals from the writing control unit 3 and gives corresponding control signals to the EB exposure unit 6. The control I/O unit 5 comprises a buffer memory 5a, an arithmetic unit 5b, a control signal generator 5c, a blanking controller 5d, a first deflection controller 5e, a second deflection controller 5f, a movement controller 5g, a third deflection controller 5h, a signal processor 5i, a signal detector 5j, a stage controller 5k, a loader controller 5l and a vacuum controller 5m.

The data storage unit 3 stores writing data and comprises a data transfer device 3a and a data storage device 3b. The data storage device 3a is, for example, a magnetic disk storing control data for controlling a writing process, and writing data representing IC patterns including a pattern of a region inside the actual pattern of contact holes, a pattern of a region inside the actual pattern of wiring lines and the like.

The EB exposure unit 6 comprises an electron optics system 6a and an xy-stage system 6b. The semiconductor wafer 2 is mounted on an xy-stage 16 capable of moving in a horizontal plane.

The xy-stage 16 is provided with an electrostatic chuck (FIG. 19) for holding the semiconductor wafer 2, and a positional variation measuring mechanism (FIG. 20) for measuring the position of a reference mask (FIG. 20) formed on the semiconductor wafer 2. The position of the reference mark formed on the semiconductor wafer 2 is detected by the signal detector 5j that detects a light beam projected on and reflected by the reference mark or the electron beam 7 projected on and reflected by the reference mark, and a laser interferometer 17 for detecting the position of the xy-stage 16. The position of the xy-stage 16 with respect to the x-axis and the y-axis is measured by a laser interference method, and data representing the measured position of the xy-stage 16 is given to an electron beam system.

An electron optics system is disposed on the path of the electron beam 7 between an electron beam source 8 and the xy-stage 16. The electron optics system comprises a first mask 9 provided with, for example, a rectangular aperture, a blanking electrode 10 for shutting off the electron beam 7, electron lenses 13 for converging the electron beam 7, correcting the rotation of the electron beam 7 about the optical axis, reducing the sectional shape of the electron beam 7 and focusing the electron beam on the semiconductor wafer 2, a first deflector 11, a second deflector 12, a second mask 14 provided with a plurality of apertures respectively having desired patterns, and a third deflector 15 for deflecting the electron beam 7 so that the electron beam 7 falls at a desired position on the semiconductor wafer 2.

The arithmetic unit 5b produces a blanking control signal for controlling the interruption of the electron beam 7 on the basis of, for example, writing data, reference mark position detection data or stage position data, a first deflection control signal data for selecting the aperture of a desired pattern formed in the second mask 14, control signal data for controlling the movement of the second mask 14 and second deflection control signal data for controlling regions and positions on the semiconductor wafer 2 to be irradiated with the electron beam 7.

The blanking controller 5d controls the blanking electrode 10 to interrupt the electron beam 7 according to control signals provided by the control signal generator 5c corresponding to beam control data given by the arithmetic unit 5b to the control signal generator 5c.

The first deflector 11 deflects the electron beam 7 so that the electron beam 7 traveled through the electron lens 13 will fall at a predetermined position on the second mask 14. The aperture having a desired pattern of the second mask 14 is selected on the basis of pattern selection control data given by the arithmetic unit 5b through the control signal generator 5c and the first deflection controller 5e to the first deflector 11.

Similarly, the size of the section of the electron beam 7 is varied by controlling the second deflector 12 through the control signal generator 5c and the second deflection controller 5f on the basis of beam size control data so that the electron beam 7 will deviate from part of the rectangular aperture of the second mask 14.

Figure 18:
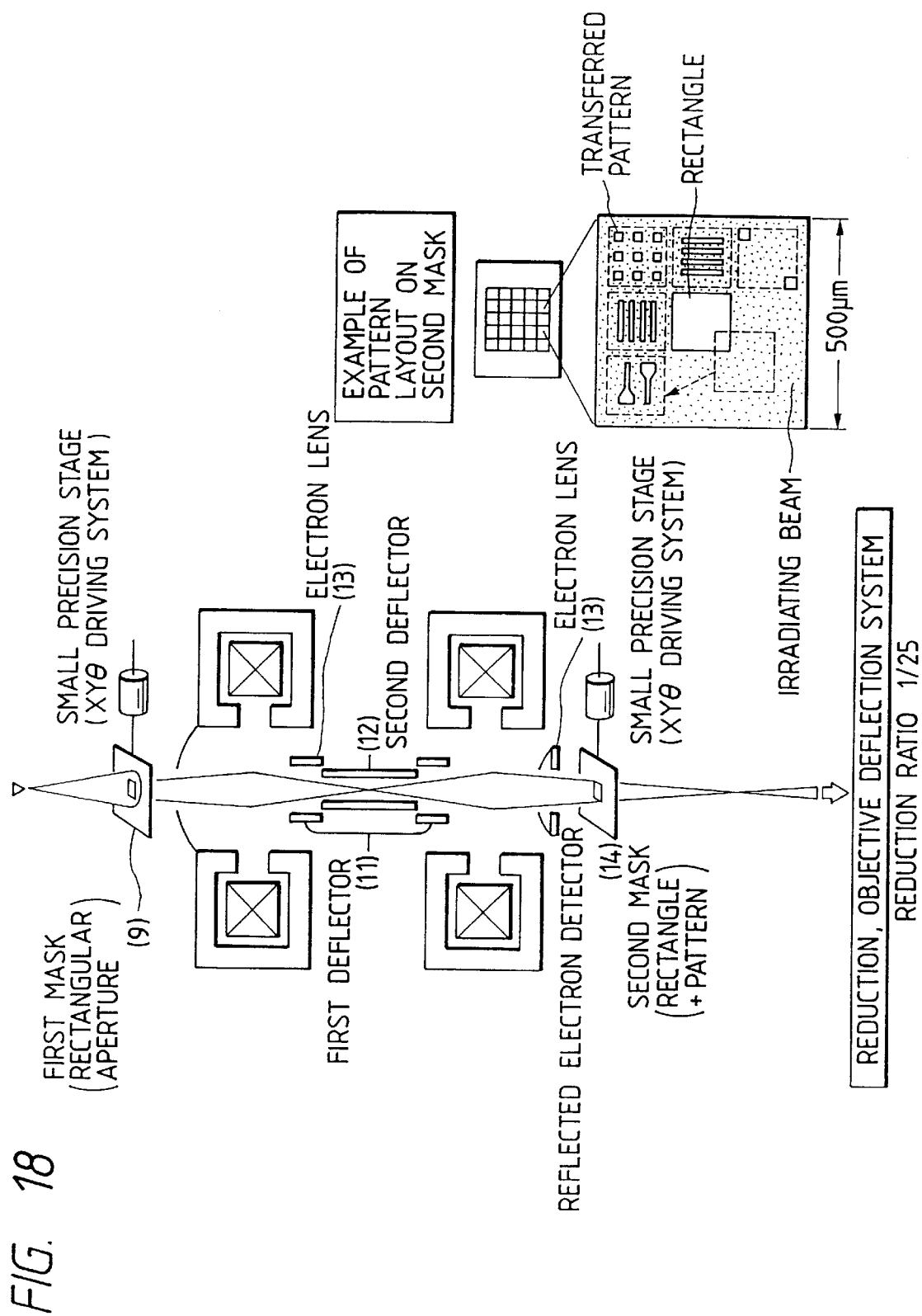
FIG. 18 is a diagrammatic view of an essential portion of the electron beam exposure apparatus of FIG. 17.

The first mask 9 and the second mask 14 are movable and are mounted respectively on mask stages (FIG. 18). The movement of the second mask 14 is controlled on the basis of movement control data given by the arithmetic unit 5b through the control signal generator 5c and the movement controller 5g to a driving unit to position the aperture having a desired pattern of the second mask 14 within a deflection region in which the electron beam 7 falls. The movement of the first mask 9 is controlled by a similar procedure.

The third deflector 15 deflects the electron beam 7 that traveled through the electron lenses 13 so that the electron beam 7 will fall at a desired position on the semiconductor wafer 2. The position of the electron beam 7 on the semiconductor wafer 2 is controlled on the basis of irradiation information data, such as data representing an irradiating region or the coordinates of the desired position to be irradiated given by the arithmetic unit 5b through the control signal generator 5c and the third deflection controller 5h to the third deflector 15.

The third deflector 15 comprises a wide deflection electrode and two quick narrow deflection electrostatic deflectors. The electron beam 7 is deflected by the combined action of the wide deflection electrode capable of defecting the electron beam 7 in a region of, for example, 5 mm$^2$ and the two quick narrow deflection electrostatic deflectors capable of deflecting the electron beam 7 respectively in regions of, for example, 500 µm and 80 µm so as to fall at a desired position on the semiconductor wafer 2. Thus the electron beam 7 can be deflected for quick, wide deflection.

The xy-stage 16 mounted with the semiconductor wafer 2 is controlled through the stage controller 5k by the control computer. The stage controller 5k controls the xy-stage 16 on the basis of measured data provided by the laser interferometer 17 capable of precision measurement of the displacement of the xy-stage 16 so that the xy-stage is positioned at a position specified by the control computer.

An electron detector is disposed above and near the xy-stage 16 to detect the position of a positioning mark, not shown, formed at a desired position on the semiconductor wafer 2 by detecting secondary electrons produced when the positioning mark is irradiated with the electron beam 7, in synchronism with the scanning operation of the electron beam 7 for specific operations. An electron beam detector, not shown, is mounted on the xy-stage 16 to detect the current intensity of the electron beam 7.

The coordinates of an exposure region on the semiconductor wafer 2 are transformed into those on a predetermined reference coordinate system on the basis of position data representing the position of the positioning mark by the signal processor 5*i*. The third deflector 15 is controlled on the basis of values obtained by adding the values of the coordinates on the reference coordinate system and parameters of the position of writing data provided by the arithmetic unit 5*b*.

A height detector (z-detector), not shown, is disposed near the electron detector. The height detector projects a light beam so as to fall on the surface of the semiconductor wafer 2 at a given angle to the surface, and detects the reflected light beam reflected by the surface of the semiconductor wafer 2 by an optical position sensor or the like for the precision measurement of the height of a position irradiated with the light beam on the semiconductor wafer 2. For purpose of convenience, an optical system comprising a light source that emits the light beam, a projection lens and a receiving lens is omitted in FIG. 17.

Height information about the height of a position on the semiconductor wafer 2 to be irradiated with the electron beam 7 provided by the height detector is converted into coordinates on the reference coordinate system by the signal processor 5*i*, and then the signal processor 5*i* gives data representing the coordinates to the arithmetic unit 5*b*. The operations of the electron lenses 13 for focusing the electron beam 7 on the semiconductor wafer 2 are controlled on the basis of the height information.

The second mask 14 is provided with a matrix of a plurality of aperture sections having an area that can be included in a region in which the electron beam 7 can be deflected by the first deflector 11. Each aperture section has a plurality of different full-transfer aperture patterns and a rectangular aperture. Each full-transfer aperture pattern consists of a plurality of patterned apertures and corresponds to, for example, a unit pattern of an semiconductor IC or the like of an iterative pattern.

A pair of isolated patterns capable of being simultaneously selected by the electron beam 7 passed through the first mask 9 are formed, for example, at diagonally opposite ends of part of the full-transfer pattern.

When transferring each full-transfer pattern onto the semiconductor wafer 2, the pair of isolated patterns are used to correct the dislocation of the second mask 14.

The relation between the excitation current and the magnification of the reduction lens 13 of the electron optic system disposed after the second mask 14, and the rotation correcting lens and the angle or rotation are determined beforehand by measurement for correction.

The second mask 14 is used in combination with the first mask 9, and the second mask 14 has at least one rectangular aperture and a plurality of patterned apertures in an area included in the region in which the electron beam 7 is deflected. A plurality of full-transfer beams different from aforesaid beams, and a variable rectangular beam can be formed by moving the second mask 14.

FIG. 18 is a diagrammatic view of assistance in explaining an essential portion of the electron beam exposure apparatus. The first mask interlocked with a mask moving mechanism, the first deflector for selecting one of the plurality of patterns of the second mask interlocked with a moving mechanism, and the first deflector for changing the size of the electron beam are arranged as shown in FIG. 18. The electron beam exposure apparatus need not necessarily be provided with any mechanism for automatically moving the first mask.

The full-transfer operation of the electron beam exposure apparatus using an electron beam will be described hereinafter by way of example.

First, the second mask moving mechanism positions the second mask 14 so that a desired aperture section is positioned on the optical axis of the electron optics system.

Then, the first deflector 11 deflects the electron beam 7 so that the electron beam 7 falls on and travels through the isolated patterns of one of the transfer aperture pattern. Then, two electron beams 7 travel toward the xy-stage 16. Faraday cups, not shown, or the like provided on the xy-stage 16 are scanned with the electron beams 7 to measure transfer errors including angular dislocation of the isolated patterns about the optical axis and magnification errors, and the measured transfer errors are stored.

Then, the electron beam 7 that traveled through the aperture of the first mask 9 is deflected by the first deflector 11 so as to fall on a desired full-transfer aperture pattern of the second mask 14. The sectional shape of the electron beam 7 is shaped by the full-transfer aperture pattern, and the shaped electron beam 7 is controlled by the electron lenses 13 corrected on the basis of corrections determined on the basis of the measured transfer errors and the third deflector 15 to irradiate a desired position on the semiconductor wafer 2 mounted on the xy-stage 16 with the electron beam 7 having a desired shape and a desired size. The electron beam resist film formed on the surface of the semiconductor wafer 2 is exposed to the electron beam 7 in the desired pattern.

Figure 19A:
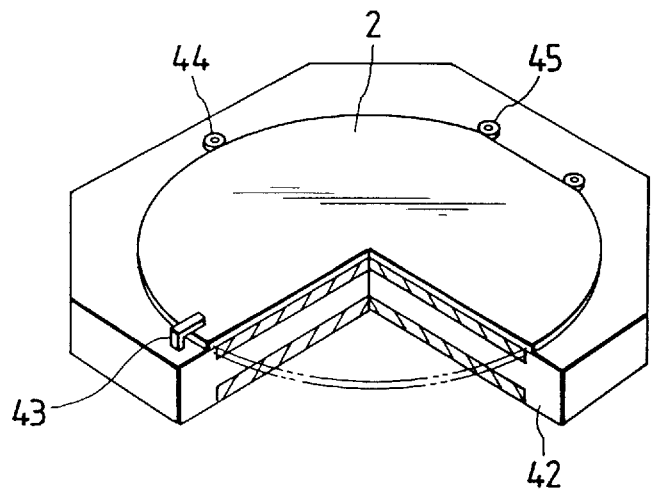
FIGS. 19(a) and 19(b) are a partly sectional perspective view and a fragmentary side view, respectively, of assistance in explaining a method of holding a semiconductor wafer by the electrostatic chuck of the electron beam exposure apparatus of FIG. 17.
Figure 19B:
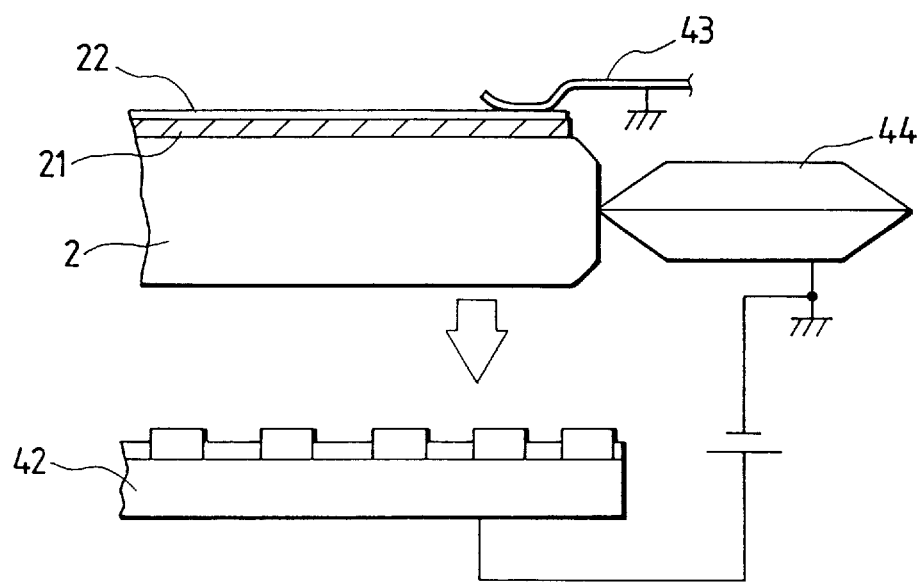
Figure 20:
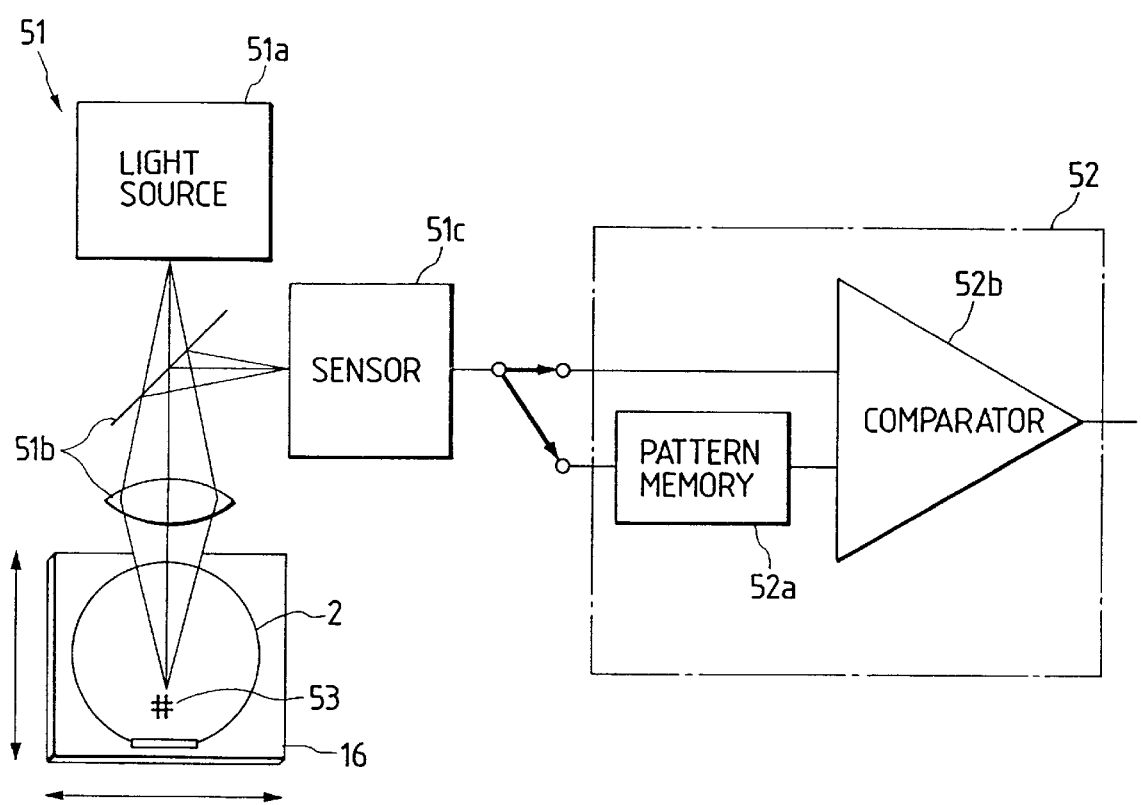
FIG. 20 is a diagrammatic view of a stage positioning mechanism included in the electron beam exposure apparatus of FIG. 17.

FIGS. 19(*a*) and 19(*b*) are views of assistance in explaining a method of holding the semiconductor wafer with the electrostatic chuck of the electron beam exposure apparatus and FIG. 20 is a diagrammatic view showing, by way of example, the positional variation measuring mechanism of the electron beam exposure apparatus.

Referring to FIGS. 19(*a*) and 19(*b*), the semiconductor wafer 2 is positioned by positioning rollers 45 and held fixedly on an electrostatic pallet 42 included in the electrostatic chuck. Although the flatness of the semiconductor wafer 2 is deteriorated with the progress of the fabricating processes, the electrostatic chuck is capable of fixedly holding the semiconductor wafer 2 in a flat state even if the semiconductor wafer 2 is warped by about 100 $\mu$m.

A current is supplied to the semiconductor wafer 2 fixedly held by the electrostatic chuck through a knife-edged contact pin 34 set in contact with the side surface of the semiconductor wafer 2. The tip of a soft contact pin 43, i.e., a grounding terminal, is in light contact with the conductive polymer film 22 formed on the semiconductor wafer 2 to keep the surface of the conductive polymer film 22 at a ground potential. The soft contact pin 43 is set in very light contact with the conductive polymer film 22 so that the conductive polymer film 22 may be neither damaged nor penetrated by the tip of the soft contact pin 43. A very small portion of the charges produced in the conductive polymer film 22 when the same is irradiated with an electron beam is dissipated through the soft contact pin 43 to the ground to prevent the dislocation of the electron beam from a correct irradiating position by the charges.

Referring to FIG. 20, the positional variation measuring mechanism of the electron beam exposure apparatus 1 comprises, as principal components, a mark detecting system 51 for detecting a reference mark 53 formed on the semiconductor wafer 2, and a data comparing system 52 for comparing two pieces of input information.

The mark detecting system 51 comprises a light source 51a that emits a light beam, a lens 51b for converging or deflecting the light beam emitted by the light source 51a, and a sensor 51c for detecting the light beam. The electron beam 7 emitted by the electron beam source 8 shown in FIG. 16 may be used instead of the light beam. The data comparing system 52 comprises a pattern memory 52a for storing information given thereto by the sensor 51c, and a comparator 52b for comparing pieces of information successively given thereto.

A method of measuring the position of the semiconductor wafer 2 to be carried out by the positional variation measuring mechanism will be described below. The semiconductor wafer 2 is mounted on the xy-stage 16, the light beam emitted by the light source 51a is projected on the reference mark 53 formed on the surface of the semiconductor wafer 2, a reflected light beam is detected by the sensor 51c, and pattern information provided by the sensor 51c is stored in the pattern memory 52a.

Then, the xy-stage 16 is moved in one direction at a given speed, desirably a writing speed at which the xy-stage 16 moves during electron beam writing or a speed higher than the writing speed, and then the xy-stage 16 is moved in the opposite direction to the initial position. Then, the reference mark 53 is detected again. The information obtained and stored previously in the pattern memory 52a before the xy-stage 16 was moved and the information obtained after the xy-stage 16 has been returned to the initial position are compared by the comparator 52b to determine whether or not the dislocation of the semiconductor wafer 2 from a correct position on the xy-stage 16 is greater than a reference value.

If the repeatability of measurement of the reference mark 53 of the semiconductor wafer 2 is not greater than the reference value, the position of the reference mark 53 is determined by using the electron beam 7. Thus, an IC pattern formed on the semiconductor wafer 2 can be correctly positioned for chips. If the repeatability is greater than the reference value, an error signal is provided, and the semiconductor wafer 2 is removed from the xy-stage 16 or the foregoing operations for chucking the semiconductor wafer 2 by the electrostatic chuck, and detecting the position of the reference mark 53 and moving the xy-stage 16 are repeated to examine the position of the semiconductor wafer 2 on the xy-stage 16 again.

FIGS. 21(a)–21(h) are flow charts of other steps of the semiconductor IC device fabricating method embodying the present invention.

First, a metal film 24, such as an Al film, deposited over the major surface of a semiconductor wafer 2 in which predetermined IC is formed, and a chemical amplification negative electron beam resist film 25 is formed over the metal film 24 by coating. The chemical amplification electron beam resist forming the chemical amplification electron beam resist film 25 contains, for example, cresol novolac resin (base resin), melamine (cross-linking agent), tris (bromoacetyl)benzene (acid producing agent), and cyclohexanone (solvent). The negative electron beam resist film 25 is baked before and after exposure for prebaking and postbaking to enhance the adhesion of the negative electron beam resist film 25 to the metal film 24.

A conductive polymer film 22 is formed over the negative electron beam resist film 25 by coating. The conductive polymer film 22 is formed to prevent the charging-up of the semiconductor wafer 2 during exposure, to suppress the aging of the negative electron beam resist film 25 after exposure and to stabilize the negative electron beam resist film 25. If the negative electron beam resist film 25 is not coated with the conductive polymer film 22, an acid produced in the negative electron beam resist film 25 by irradiation with the electron beam is deactivated with time and hence the dimensional accuracy of the resist pattern is deteriorated accordingly.

Then, the semiconductor wafer 2 is mounted and positioned on the xy-stage 16 of the electron beam exposure apparatus 1 of FIG. 17, and then the surface of the semiconductor wafer 2 is irradiated with an electron beam 7 according to writing data stored in the data storage device 3a of the data storage unit 3, i.e., writing data representing a portion inside the actual pattern of wiring lines. When irradiated with the electron beam 7, the acid producing agent is hydrolyzed and produces an acid.

Then, the negative electron beam resist film 25 is baked to enhance the dissolving speed of the unirradiated portion of the negative electron beam resist film 25, the conductive polymer film 22 is removed by washing the semiconductor wafer 2, and then the negative electron beam resist film 25 is developed by an organic solvent to form a resist pattern. In some cases where the negative electron beam resist film 25 and the conductive polymer film 22 are used in combination, an unnecessary reaction occurs in the interface between the negative electron beam resist film 25 and the conductive polymer film 22. In such a case, the conductive polymer film 22 may be removed by washing before baking.

Then, the metal film 24 is etched using the resist pattern as a mask to form wiring lines 24A, and then the negative electron beam resist film 25 is removed from the surface of the semiconductor wafer 2.

Figure 21:
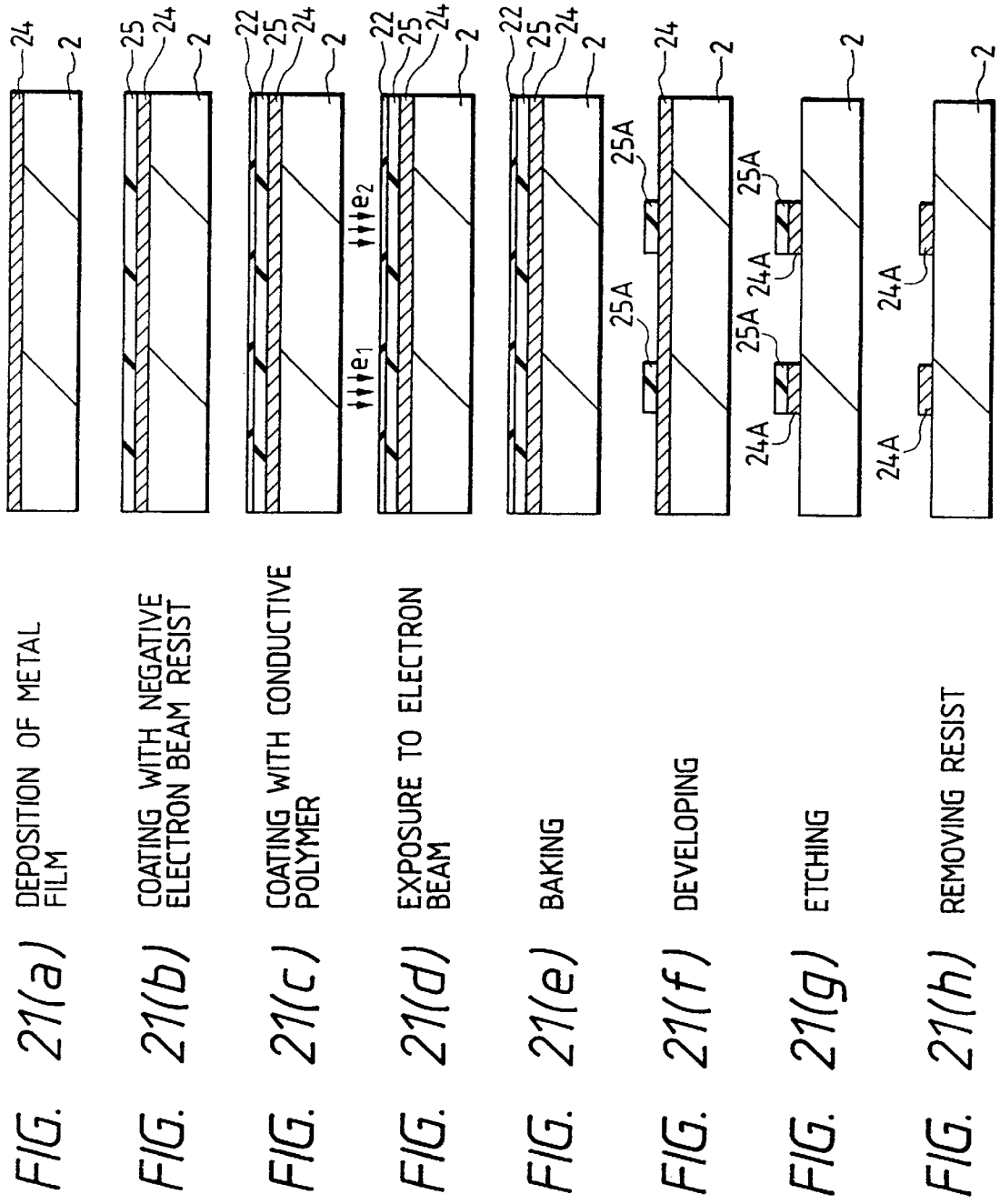
FIGS. 21(a)–21(h) are typical sectional views of a workpiece in different phases of a semiconductor IC device fabricating method embodying the present invention.

In the process for irradiating the semiconductor wafer with the electron beam, restrictions are placed on the electron beam resist to be used depending on whether a single shaped electron beam is used or whether two shaped electron beams are used. That is, when a single shaped electron beam is used, regions e1 and e2 shown in FIG. 21 are irradiated successively and not simultaneously, the ratio of writing area of the contact holes for connecting wiring lines is ½ or below when a negative resist is used and hence the throughput of the writing process can be increased. On the contrary, if a positive resist is used, the ratio of writing area is greater than ½, which increases time necessary for writing entailing the deterioration of pattern writing accuracy.

When two shaped electron beams are used for exposure in at least some of the processes, the regions e1 and e2 shown in FIG. 21 are irradiated simultaneously, and either a positive resist or a negative resist is used simply depending on whether or not irradiated portions of the resist film are to be removed. When two shaped electron beams are used, which will be described later, a beam transfer mask (full-transfer mask) having patterns for irradiating two or more regions can be made to irradiate desired regions with electron beams, a negative resist can be used and, consequently, quick exposure in a full transfer system is feasible. If a positive resist is used, a beam transfer mask having patterns for irradiating two or more regions cannot be made.

Thus, this embodiment uses the positive electron beam resist film 21 and the negative electron beam resist film 25 selectively for the process of forming the contact holes 23 and the process of forming the wiring lines 24A, respectively, so that time necessary for electron beam writing can be reduced.

The conductive polymer films 22 formed over the positive electron beam resist film 21 and the negative electron beam resist film 25 prevent the charging-up of the electron beam resist films 21 and 25 during electron beam writing and stabilize the electron beam resist films 21 and 25, which improves writing accuracy.

The semiconductor IC fabricating method in this embodiment will be described as applied to fabricating a bipolar LSI circuit for use as an ASIC will be described hereinafter with reference to FIGS. 22 and 23.

Figure 22:
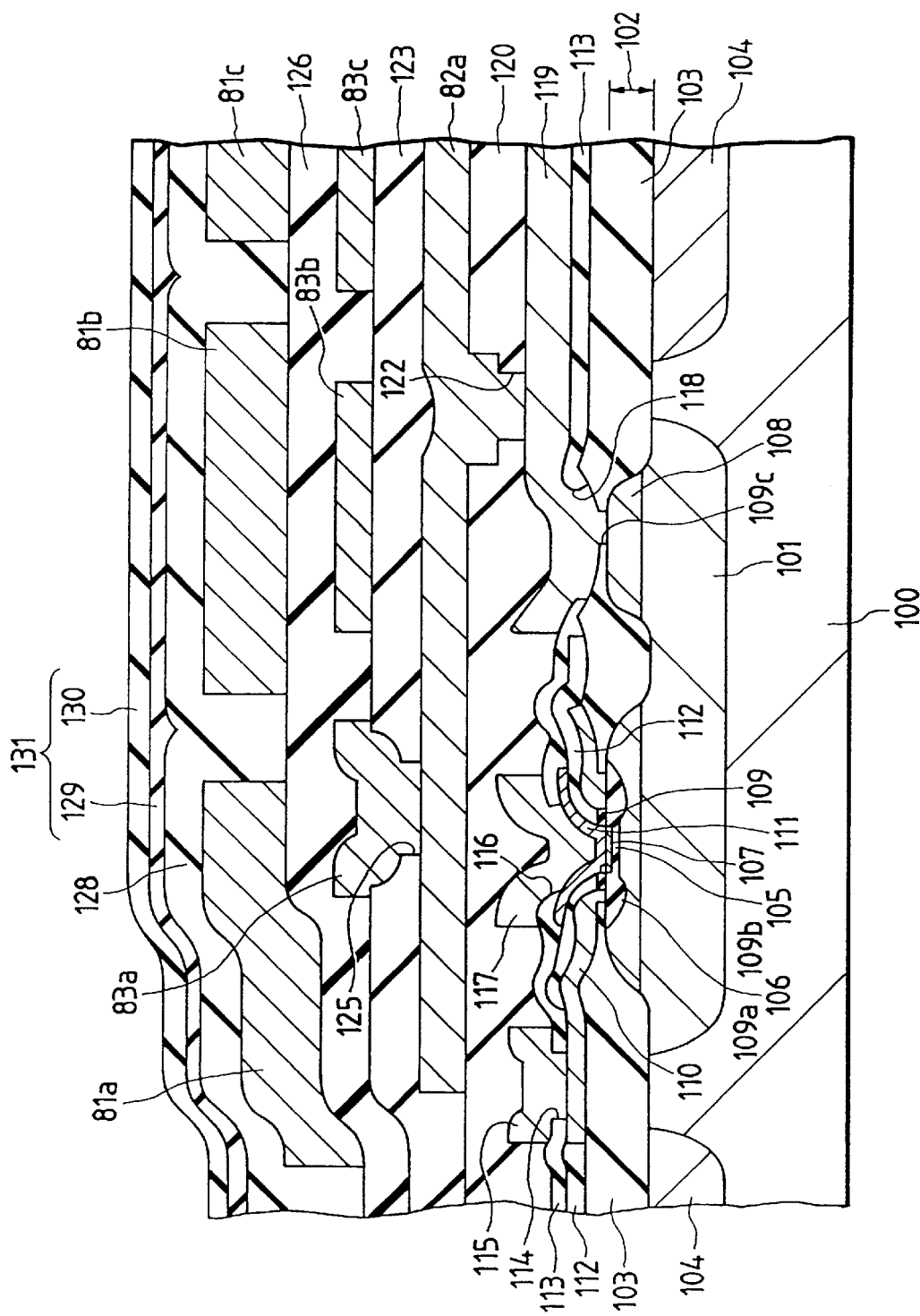
FIG. 22 is a typical sectional view of an essential portion of a semiconductor IC device, of assistance in explaining a semiconductor IC device fabricating method embodying the present invention.
Figure 23:
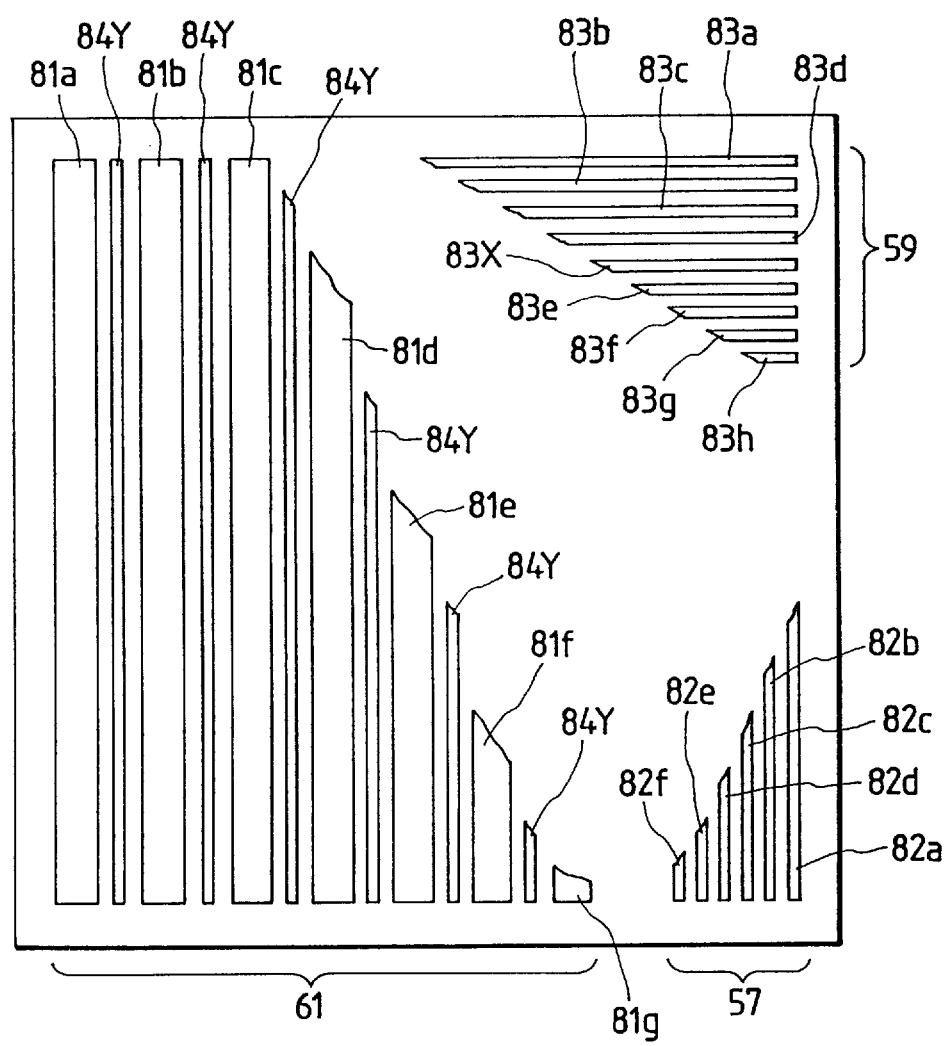
FIG. 23 is a plan view showing the layout of a second, a third and a fourth metal wiring layer included in the semiconductor IC device of FIG. 22.

FIG. 22 is a typical sectional view of an essential portion of a bipolar LSI circuit formed on a semiconductor wafer and FIG. 23 is a typical plan view showing the layout of a second, a third and a fourth wiring layer of the bipolar LSI circuit, in which semiconductor devices are omitted.

Referring to FIG. 22, an n-type region 101 is formed in the surface of a semiconductor wafer 100 of p-type single crystal silicon, and an n-type epitaxial layer 102 is formed on the surface of the semiconductor wafer 100. A field insulating film 103, such as a silicon dioxide film, for isolating the semiconductor devices from each other and isolating the characteristic elements of each semiconductor device from each other is formed in part of the epitaxial layer 102.

Underlying the field insulating film 103 are p-type channel stopper regions 104 formed in the surface of the semiconductor wafer 100. A p-type intrinsic base region 105, a p-type graft base region 106 and an n-type collector region 108 are formed in a portion of the epitaxial layer 102 surrounded by the field insulating film 103. An n-type emitter region is formed in the intrinsic base region 105. The emitter region 107, the intrinsic base region 105, the epitaxial layer 102 underlying the intrinsic base region 105 and the n-type region 101 constitute an npn bipolar transistor.

A light projection exposure system using photomasks is used in processes for constructing the bipolar transistor. An electron beam exposure system in accordance with the present invention is used in processes for forming wiring lines over the bipolar transistors and forming contact holes for connecting the bipolar transistor and the for connecting wiring lines, and wiring lines in an upper wiring layer and those in a lower wiring layer.

When the light projection exposure system using photomasks is used for forming the bipolar transistors, the number of wafers processed in unit time is greater than that when the electron beam exposure system is used and hence exposure cost is lower when the light projection system is used than when the electron beam exposure system is used. The use of the electron beam exposure system for forming the wiring lines is suitable for fabricating ICs meeting user's requirements in a short period of time.

As shown in FIG. 22, contact holes 109a, 109b and 109c respectively corresponding to the graft base region 106, the emitter region 107 and the collector region 108 are formed in an insulating film 109 contiguous with the field insulating film 103. The graft base region 106 is connected through the contact hole 109a to a base electrode 110 of a p-Si film. An emitter electrode 111 of a p-Si film is formed on the emitter region 107.

Insulating films 112 and 113, i.e., silicon dioxide films, are formed on the field insulating film 103. Connecting holes 114, 116 and 118 respectively corresponding to the base electrode 110, the emitter electrode 111 and the collector region 108 are formed in the insulating films 112 and 113. The etching process employing the electron beam exposure system, previously described with reference to FIG. 16, namely, the etching process using the positive electron beam resist film as a mask, is used for forming the contact holes 114, 116 and 118.

The etching system employing the electron beam exposure system is capable of efficiently forming the contact holes 114, 116 and 118 even if different types of semiconductor ICs, such as semiconductor ICs for use as ASICs, have the contact holes at different positions. When different types of semiconductor ICs are the same in the respective positions of the contact holes 114, 116 and 118, an etching process employing the light projection exposure system using photomasks, which is used for fabricating transistors, may be used for forming the contact holes 114, 116 and 118.

The base electrode 110 is connected through the contact hole 114 to an Al wiring line 115 of a first wiring layer, the emitter electrode 111 is connected through the contact hole 116 to a wiring line 117 of the first wiring layer, and the collector region 108 is connected through the contact holes 118 and 109c to a wiring line 119 of the first wiring layer.

The wiring lines 115, 117 and 119 of the first wiring layer are formed by the method previously described with reference to FIG. 21, namely, the method that etches the metal film using the negative electron beam resist film as a mask. In this wiring line forming process, the influence of charging-up during writing is insignificant because the metal film for forming the wiring layer underlies the negative electron beam resist film. Therefore, the conductive polymer film overlying the negative electron beam resist film functions principally for stabilizing the negative electron beam resist film.

A layer insulating film 120 formed by superposing a silicon nitride film and a SOG (spin-on glass) film overlies the first wiring layer having the wiring lines 115, 117 and 119. The SOG film is formed by a coating process, and the silicon nitride film and the silicon dioxide film are deposited by a plasma CVD process.

A second wiring layer, such as an Al film, having a wiring line 82a is formed on the layer insulating film 120. The wiring lines of a wiring line group 57 of the second wiring layer are extended mainly vertically as viewed in FIG. 23. For example, the wiring lines 82a to 82f of the wiring line group 57 of the second wiring layer are 3.5 $\mu$m in width and are arranged at a pitch of 5 $\mu$m. The wiring lines 82a to 82f are formed by etching using a negative electron beam resist film as a mask.

The wiring line 82a of the second wiring layer is connected through a stepped contact hole 122 formed in the layer insulating film 120 to the wiring line 119 of the first wiring layer. The stepped contact hole 122 improves the step coverage of the wiring line 82a of the second wiring layer within the contact hole 122. The contact hole 122 is formed by etching using a positive electron beam resist film as a mask.

A layer insulating film 123 similar to the layer insulating film 120 is formed on the second wiring layer having the wiring line 82a. A third wiring layer having wiring lines 83a, 83b and 83c formed by etching, for example, an Al film is formed on the layer insulating film 123. The wiring lines of a wiring line group 59 of the third wiring layer are extended mainly horizontally as viewed in FIG. 22. For example, the wiring lines 83a to 83h of the wiring line group 59 of the third wiring layer are 3.5 μm in width and are arranged at a pitch of 5 μm for mutual connection according to necessity. Spare wiring lines 83X are formed every fifth wiring lines of the wiring line group 59 of the third wiring layer. The wiring lines 83a to 83f and 83X are formed by etching using a negative electron beam resist film as a mask.

The wiring line 83a of the third wiring layer is connected through a contact hole 125 formed in the layer insulating film 123 to the wiring line 82a of the second wiring layer. The contact hole 125 is formed by etching using a positive electron beam resist film.

A layer insulating film 126 similar to the layer insulating films 120 and 123 is formed over the third wiring layer having the wiring lines 83a, 83b and 83c, and a fourth wiring layer having wiring lines 81a, 81b and 81c of, for example, an Al film is formed on the layer insulating film 126.

The wiring lines of a wiring line group 61 of the fourth wiring layer are extended mainly vertically as viewed in FIG. 23. The wiring lines 81a to 81g of the wiring line group 61 of the fourth wiring layer are power lines or reference voltage lines (VESL=–4 V, VEE=–3 V, VTT=–2 V, VCC1, VCC2 and VCC3=0 V for an ECL circuit). The widths of the wiring lines 81a to 81g are in the range of 50 to 200 μm. The wiring lines 81a to 81g are 2 μm in thickness, and the wiring space between the wiring lines 81a to 81g is 2 μm. Wiring lines 84Y are spare wiring lines of 10 μm in width. The wiring lines 81a to 81g and 84Y are formed by etching using a negative electron beam resist film as a mask.

An insulating film 128 is formed over the fourth wiring layer having the wiring lines 81a, 81b and 81c to flatten the surface of the workpiece. The insulating film 128 is a silicon dioxide film formed by a bias sputtering process or a combination of a plasma CVD process and a sputter etching process. The insulating film 128 may be a silicate glass film, such as a PSG (phosphosilicate glass) film, a BSG (borosilicate glass) film or a BPSG (borophosphosilicate glass) film formed by a combination of an atmospheric pressure CVD process and a sputter etching process. Grooves between the wiring lines 81a, 81b and 81c of the fourth wiring layer are filled up with the insulating film 128 and the insulating film 128 has a substantially flat surface.

A silicon nitride film 129 is deposited over the insulating film 128 by a plasma CVD process, and a silicon dioxide film 130 is deposited over the silicon nitride film 129 by a plasma CVD process. The silicon nitride film 129 and the silicon dioxide film 130 constitute a passivation film 131 for protecting the surface of the semiconductor wafer 100.

Since the insulating film 128 has a flat surface as mentioned above, the silicon nitride film 129 is comparatively uniform in thickness and quality and hence the passivation film 131 has a high moisture resistance to inhibit the permeation of moisture. Accordingly, the LSI circuit may be packaged in either a hermetic sealing package or a nonhermetic sealing package.

A semiconductor IC device fabricating method embodying the present invention will be described as applied to fabricating a twin well CMOS static RAM (SRAM) with reference to FIGS. 24 to 30.

Figure 24:
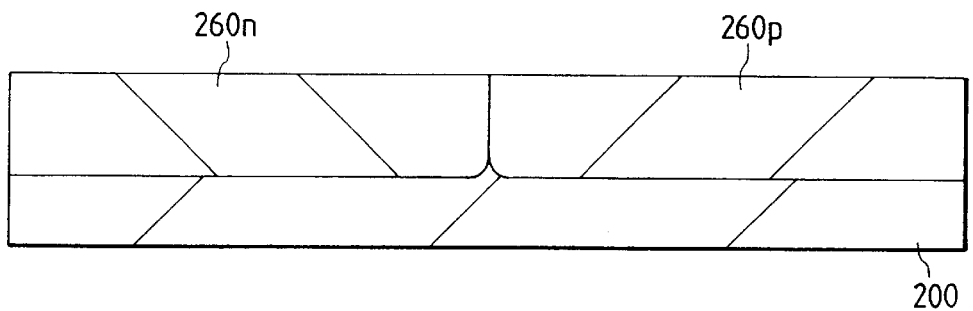
FIG. 24 is a typical sectional view of an essential portion of a semiconductor wafer, of assistance in explaining a semiconductor IC device fabricating method embodying the present invention.

FIG. 24 is a view of assistance in explaining a twin well forming process for forming an n-type well and a p-type well. Shown in FIG. 24 are a semiconductor wafer 200 of n⁻-type single crystal silicon, an n-type well 260n and a p-type well 260p.

Figure 25:
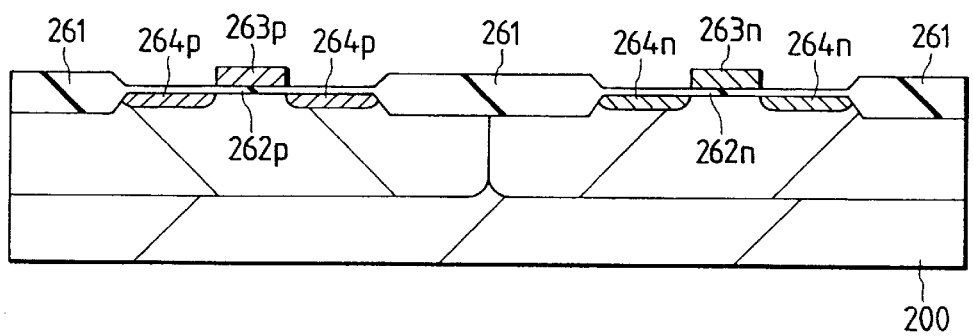
FIG. 25 is a typical sectional view of an essential portion of a workpiece, of assistance in explaining a semiconductor IC device fabricating method embodying the present invention.

FIG. 25 is a view of assistance in explaining a gate forming process subsequent to the twin well forming process, and a source/drain forming process for forming the source and the drain of each MOSFET by ion implantation in a self-alignment mode using a gate formed by the gate forming process. Shown in FIG. 25 are a field oxide film 261, gate oxide films 262n and 262p, gate electrodes 263n and 263p of p-Si, an n-type source 264n, an n-type drain 264n, a p-type source 264p and a p-type drain 264p.

Figure 26:
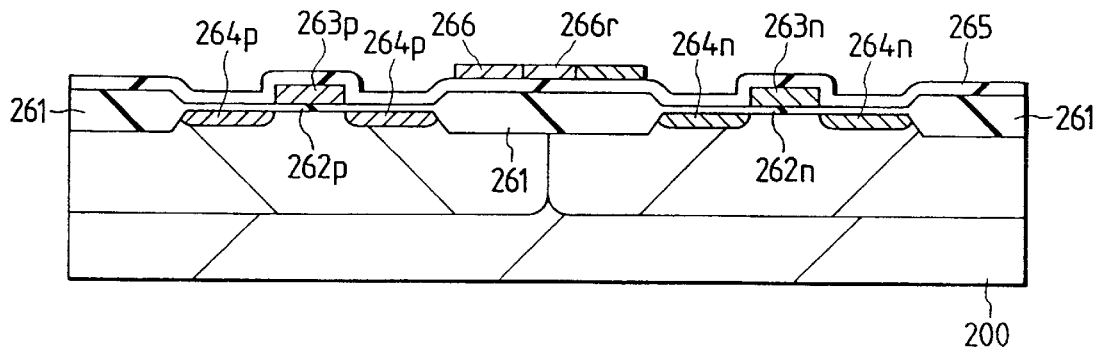
FIG. 26 is a typical sectional view of an essential portion of a workpiece, of assistance in explaining a semiconductor IC device fabricating method embodying the present invention.

FIG. 26 is a view of assistance in explaining a layer insulating film forming process, and a process for forming p-Si wiring lines of a second wiring layer and high-resistance resistors. Shown in FIG. 26 are a layer insulating film 265, a p-Si wiring line 266, a p-Si high-resistance resistor 266r serving as a negative resistance of the memory cells of the SRAM.

Figure 27:
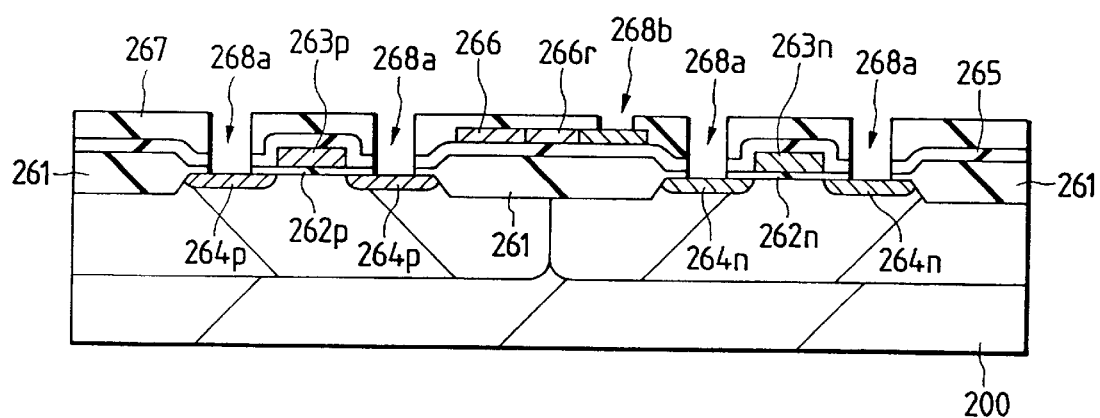
FIG. 27 is a typical sectional view of an essential portion of a workpiece, of assistance in explaining a semiconductor IC device fabricating method embodying the present invention.

FIG. 27 is a view of assistance in explaining a flattening process using SOG and a contact hole forming process. Shown in FIG. 27 are a SOG film 267, contact holes 268a reaching the semiconductor wafer 100, and a contact hole 268b through which the p-Si wiring line 266 is connected to an overlying layer.

Figure 28:
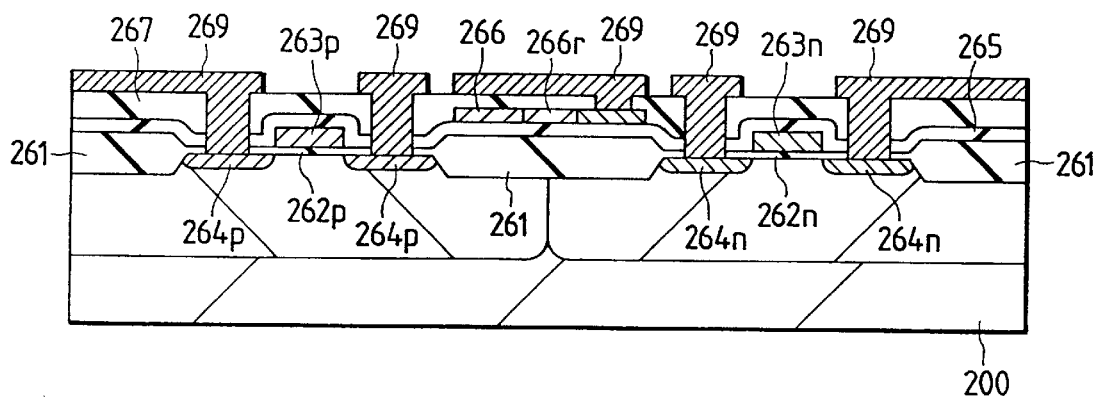
FIG. 28 is a typical sectional view of an essential portion of a workpiece, of assistance in explaining a semiconductor IC device fabricating method embodying the present invention.

FIG. 28 is a view of assistance in explaining a first wiring layer forming process. In FIG. 28, indicated at 269 are Al wiring lines of a first wiring layer.

Figure 29:
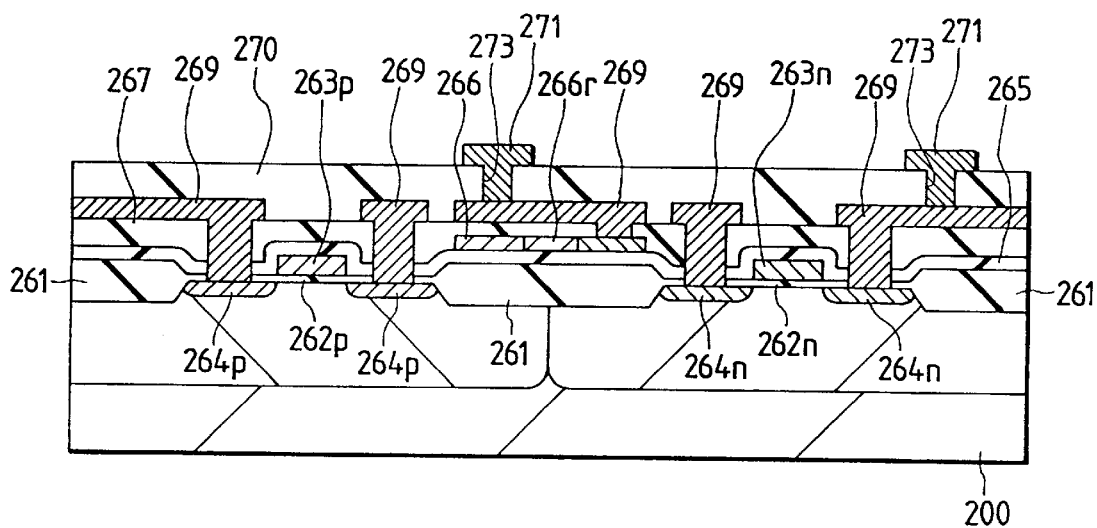
FIG. 29 is a typical sectional view of an essential portion of a workpiece, of assistance in explaining a semiconductor IC device fabricating method embodying the present invention.

FIG. 29 is a view of assistance in explaining a layer insulating film forming process for forming a layer insulating film over the wiring lines 269 of the first wiring layer and a second wiring layer forming process. In FIG. 29, indicated at 270 is a layer insulating film formed over the Al wiring lines 269 of the first wiring layer, and at 271 are Al wiring lines of a second wiring layer connected through the contact holes to the wiring lines 269 of the first wiring layer.

Figure 30:
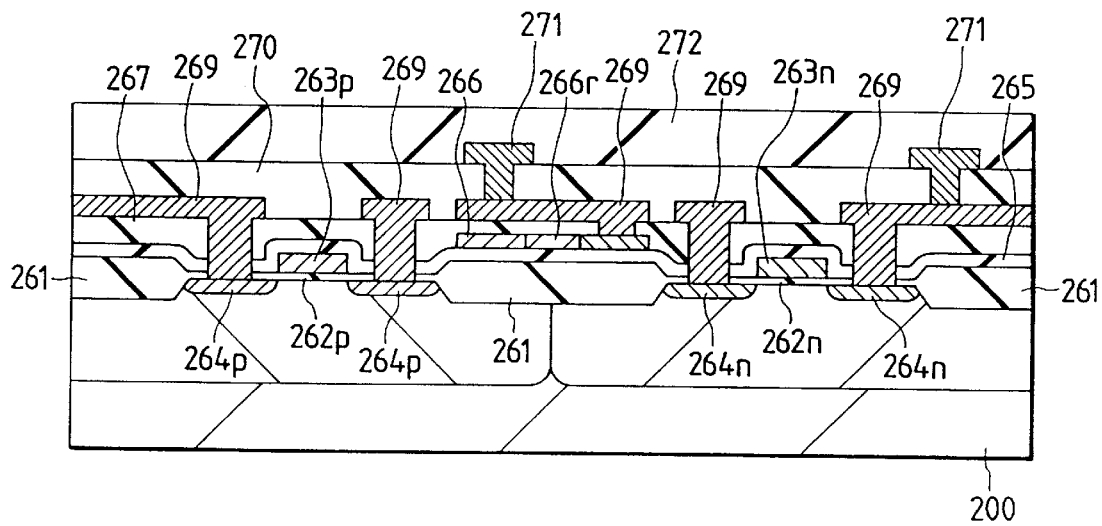
FIG. 30 is a typical sectional view of an essential portion of a workpiece, of assistance in explaining a semiconductor IC device fabricating method embodying the present invention.

FIG. 30 is a view of assistance in explaining a final passivation film forming process for forming a final passivation film of the wiring lines 271 of the second wiring layer. In FIG. 30, indicated at 272 is a final passivation film.

Figure 31:
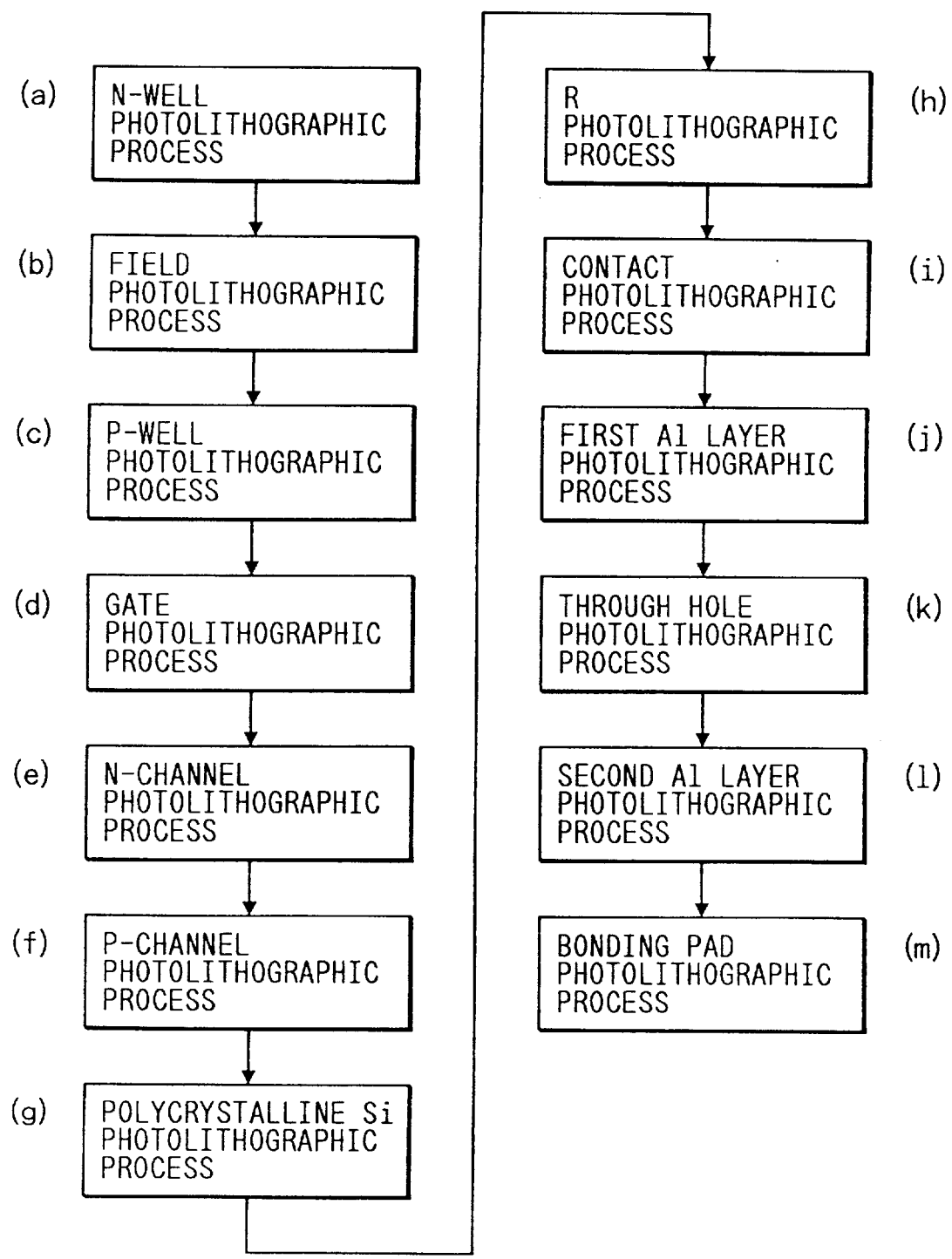
FIG. 31 is a flow chart of a photoresist film forming procedure included in a semiconductor IC device fabricating method embodying the present invention.

FIG. 31 is a view of assistance in explaining photolithographic processes, namely, exposure processes, included in the process of fabricating the SRAM. In FIG. 31, an n-well photolithographic process P1 forms a photoresist pattern covering portions of the surface of the semiconductor wafer other than that in which the n-type well 260n is formed, by processing a silicon nitride film. A field photolithographic process P2 forms a photoresist film over the silicon nitride film and patterns the photoresist film to pattern the silicon nitride film so that the active regions of n-type channels and p-type channels are covered.

A p-well photolithographic process P3 patterns a photoresist film covering the n-type well 260n to form a channel stop region for the p-type well 260p. A gate photolithographic process P4 patterns a photoresist film formed over a polycrystalline film formed over the entire surface of the semiconductor wafer to pattern the gate electrodes 263n and 263p.

An n-channel photolithographic process P5 patterns a photoresist film on the side of the p-type channel for the ion-implantation of an n-type impurity in the n-type channel using the gate electrode 263n as a mask. A p-channel photolithographic process P6 patterns a photoresist film on the side of the n-type channel for the ion-implantation of a p-type impurity into the p-type channel using the gate electrode 263p as a mask.

A p-Si photolithographic process P7 patterns a photoresist film formed over a p-Si film over the entire surface to pattern a second p-Si film for forming the wiring lines 266 or the high-resistance resistor 266r (FIG. 26). An R photolithographic process P8 patterns a photoresist film that forms a mask covering the high-resistance resistor 266r (FIG. 26)

for the ion-implantation of an impurity into regions other than that corresponding to the high-resistance resistor 266r.

A contact photolithographic process P9 forms a photoresist film and patterns the photoresist film by a positive process to form a photoresist pattern for forming the contact holes 268a and 268b (FIG. 27) for connecting the semiconductor wafer 200, the sources and drains 264n and 264p, the first p-Si layer and the second p-Si layer to the wiring lines 269 of the first wiring layer. A first Al layer photolithographic process P10 forms a photoresist pattern for patterning a first Al wiring layer to form the wiring lines 269.

A through hole photolithographic process P11 forms a photoresist pattern for forming contact holes for connecting the wiring lines 269 of the first Al wiring layer and the wiring lines 271 of a second Al wiring layer. A second Al layer photolithographic process P12 forms a photoresist pattern for patterning the second Al wiring layer to form the wiring lines 271. A holding pad photolithographic process P13 forms a photoresist film over the final passivation film 272 excluding portions of the final passivation film 272 corresponding to bonding pads to form openings of about 100 μm square in the final passivation film 272.

Since the minimum sizes of shapes to be formed by the n-well photolithographic process P1, the n-channel photolithographic process P5, the p-channel photolithographic process P6 and the bonding pad photolithographic process P13 are comparatively large, the electron beam exposure system need not be applied to those processes. The electron beam exposure system in accordance with the present invention is applied to the rest of the processes.

The gate photolithographic process P4 uses a chemical amplification negative electron beam resist for forming the gate electrodes 263n and 263p, and a chemical amplification positive electron beam resist for forming the contact holes 268a and 268b for connecting the sources and drains 264n and 264p to the wiring lines 269 of the first Al wiring layer, whereby the gate length of the gate electrodes 263a and 263p and the diameter of the contact holes 268a and 268b can be reduced to sizes not greater than the wavelength, for example, on the order of 0.3 μm, of exposure light used by the light projection exposure system.

Although the semiconductor IC device fabricating method in the second embodiment according to the present invention has been specifically described, naturally, the present is not limited in its practical application to the foregoing embodiment and many changes and variations may be made therein without departing from the gist of the present invention.

Although the embodiment has been described as applied to wiring line forming processes and contact hole forming processes, the present invention is applicable also to IC device fabricating processes.

The following are representative effects of the embodiment of the present invention.

Time necessary for electron beam writing when forming an IC pattern by using a resist pattern formed by irradiating a chemical amplification electron beam resist film formed over a semiconductor wafer as a mask can be reduced because either a chemical amplification positive electron beam resist or a chemical amplification negative electron beam resist is used selectively according to whether a single electron beam is used or whether two electron beams are used, the ratio of an area to be exposed to the electron beam and the IC fabricating process and, consequently, the use of chemical amplification electron beam resists realize electron beam direct writing at a high throughput.

The conductive polymer film formed over the chemical amplification electron resist film prevents the charging-up of the chemical amplification electron beam resist film during electron beam writing and stabilizes the chemical amplification electron beam resist film, which enables high-accuracy electron beam direct writing using the chemical amplification electron beam resist film.

I claim:

1. A process of forming patterns overlying a major surface of a plate member using a resist pattern as an etching mask, the resist pattern being formed by irradiating a chemical amplification electron beam resist film, overlying the major surface of the plate member, with at least one electron beam, comprising:

(a) forming a chemical amplification electron beam resist film over a first film, and coating a protective polymer film over the resist film;

(b) irradiating the resist film and protective polymer film with the at least one electron beam, forming an irradiated protective polymer film;

(c) removing the irradiated protective polymer film;

(d) after removing the irradiated protective polymer film, baking the resist film to promote a resist dissolving reaction using, as a catalyst, an acid produced in the resist film by irradiating the resist film with the at least one electron beam;

(e) developing the resist film to form the resist pattern; and (f) etching the first film by using the resist pattern as a mask to form the patterns.

2. A process of forming patterns as recited in claim 1, wherein said patterns are opening patterns.

3. A process of forming patterns as recited in claim 1, wherein said patterns are thin film patterns.

4. A process of forming patterns as recited in claim 1, wherein the resist film is a positive resist film.

5. A process of forming patterns as recited in claim 4, wherein the patterns are opening patterns in the first film.

6. A process of forming patterns overlying a major surface of a plate member using a resist pattern as an etching mask, the resist pattern being formed by irradiating a chemical amplification electron beam resist film, overlying the major surface of the plate member, with at least one electron beam, comprising:

(a) forming a chemical amplification electron beam resist film over a first film, and coating a protective polymer film on the resist film;

(b) irradiating the resist film and the protective polymer film with the at least one electron beam, forming an irradiated protective polymer film;

(c) removing the irradiated protective polymer film;

(d) after removing the irradiated protective polymer film, baking the resist film to promote a resist dissolving reaction using, as a catalyst, an acid produced in the resist film by irradiating the resist film with the at least one electron beam;

(e) developing the resist film to form the resist pattern; and (f) etching the first film by using the resist pattern as a mask to form the patterns.

7. A process of forming patterns as recited in claim 6, wherein said patterns are opening patterns.

8. A process of forming patterns as recited in claim 6, wherein said patterns are thin film patterns.

9. A process of forming patterns as recited in claim 6, wherein the protective film is formed directly on the resist film.

10. A process of forming patterns as recited in claim 9, wherein the resist film is a positive resist film.

11. A process of forming patterns as recited in claim 10, wherein the patterns are opening patterns in the first film.

12. A process of forming patterns overlying a major surface of a plate member using a resist pattern as an etching mask, the resist pattern being formed by irradiating a chemical amplification electron beam resist film, overlying the major surface of the plate member, with at least one electron beam, comprising:

(a) forming a chemical amplification electron beam resist film over a first film, and coating a protective polymer film over the resist film;

(b) irradiating the resist film and the protective polymer film with the at least one electron beam, forming an irradiated protective polymer film;

(c) removing the irradiated protective polymer film;

(d) after removing the irradiated protective polymer film, baking the resist film;

(e) developing the resist film to form the resist pattern; and (f) etching the first film by using the resist pattern as a mask to form the patterns.

13. A process of forming patterns as recited in claim 12, wherein said patterns are opening patterns.

14. A process of forming patterns as recited in claim 12, wherein said patterns are thin film patterns.

15. A process of forming patterns as recited in claim 12, wherein the resist film is a positive resist film.

16. A process of forming patterns as recited in claim 15, wherein the patterns are opening patterns in the first film.

17. A process of forming patterns overlying a major surface of a plate member using a resist pattern as an etching mask, the resist pattern being formed by irradiating a chemical amplification electron beam resist film, overlying the major surface of the plate member, with at least one electron beam, comprising:

(a) forming a chemical amplification electron beam resist film over a first film, and coating a protective polymer film on the resist film;

(b) irradiating the resist film and the protective polymer film with the at least one electron beam, forming an irradiated protective polymer film;

(c) removing the irradiated protective polymer film;

(d) after removing the irradiated protective polymer film, baking the resist film;

(e) developing the resist film to form the resist pattern; and (f) etching the first film by using the resist pattern as a mask to form the patterns.

18. A process of forming patterns as recited in claim 17, wherein said patterns are opening patterns.

19. A process of forming patterns as recited in claim 17, wherein said patterns are thin film patterns.

20. A process of forming patterns as recited in claim 17, wherein the protective polymer film is formed directly on the resist film.

21. A process of forming patterns as recited in claim 20, wherein the resist film is a positive resist film.

22. A process of forming patterns as recited in claim 21, wherein the patterns are opening patterns in the first film.

* * * * *